(12) United States Patent
Gutman et al.

(10) Patent No.: US 11,387,933 B2
(45) Date of Patent: Jul. 12, 2022

(54) DYNAMIC TRANSMISSION FRONT END AND DIGITAL-TO-ANALOG CONVERTER IN MODEM

(71) Applicant: QUALCOMM Incorporated, San Diego, CA (US)

(72) Inventors: Igor Gutman, Ramat Gan (IL); Shahin Mehdizad Taleie, San Diego, CA (US); Oren Matsrafi, Karkur (IL); Ronen Greenberger, Modiin (IL); Gal Keret, Raanana (IL); Yossi Waldman, Olesh (IL); Gideon Shlomo Kutz, Ramat Hasharon (IL)

(73) Assignee: QUALCOMM Incorporated, San Diego, CA (US)

( * ) Notice: Subject to any disclaimer, the term of this patent is extended or adjusted under 35 U.S.C. 154(b) by 167 days.

(21) Appl. No.: 16/778,608

(22) Filed: Jan. 31, 2020

(65) Prior Publication Data
US 2021/0242958 A1   Aug. 5, 2021

(51) Int. Cl.
| H04L 1/00 | (2006.01) |
| H03M 1/66 | (2006.01) |
| H04W 72/04 | (2009.01) |
| H04W 52/14 | (2009.01) |

(52) U.S. Cl.
CPC ............ *H04L 1/0003* (2013.01); *H03M 1/66* (2013.01); *H04L 1/0009* (2013.01); *H04W 52/146* (2013.01); *H04W 72/042* (2013.01); *H04W 72/0413* (2013.01)

(58) Field of Classification Search
CPC ...... H04L 1/0003; H04L 1/0009; H03M 1/66; H04W 52/146; H04W 72/0413; H04W 72/042
See application file for complete search history.

(56) References Cited

U.S. PATENT DOCUMENTS

| 6,504,863 B1 * | 1/2003 | Hellmark | H03M 1/129 |
| | | | 341/139 |
| 6,609,225 B1 * | 8/2003 | Ng | H03M 13/091 |
| | | | 714/781 |

(Continued)

FOREIGN PATENT DOCUMENTS

| CN | 111684743 A | * | 9/2020 | ........ H04W 72/1263 |
| EP | 1704693 A1 | * | 9/2006 | ........... H04L 1/0009 |

(Continued)

*Primary Examiner* — Eric Nowlin
(74) *Attorney, Agent, or Firm* — Kevin M. Donnelly

(57) ABSTRACT

Methods, systems, and devices for wireless communications are described. A user equipment (UE) may receive a downlink control message from a base station indicating a modulation and coding scheme (MCS) associated with an uplink transmission, a number of layers associated with the uplink transmission, or both. The UE may determine to adjust (for example, reduce) a first number of bits based on the MCS, the number of layers, or both. The first number of bits may include an effective number of bits (ENOB) supported at a digital-to-analog converter (DAC) of the UE, a number of bits (NOB) supported at a transmission front end (TxFE) component of the UE, or both. The UE may transmit the uplink transmission to the base station according to the adjusted first number of bits.

20 Claims, 17 Drawing Sheets

(56) References Cited

U.S. PATENT DOCUMENTS

| | | | | |
|---|---|---|---|---|
| 6,892,177 B2* | 5/2005 | Oliveira | | H03G 7/007 |
| | | | | 341/139 |
| 7,333,556 B2* | 2/2008 | Maltsev | | H04L 1/0003 |
| | | | | 375/295 |
| 7,555,269 B2* | 6/2009 | Tamaki | | H04L 1/0003 |
| | | | | 375/260 |
| 7,656,960 B2* | 2/2010 | Tamaki | | H04L 1/0023 |
| | | | | 375/262 |
| 7,965,215 B2* | 6/2011 | Rofougaran | | H03M 1/186 |
| | | | | 341/155 |
| 8,295,307 B2* | 10/2012 | Eitan | | H04L 1/16 |
| | | | | 370/470 |
| 8,295,780 B2* | 10/2012 | Kim | | H04L 1/0023 |
| | | | | 455/69 |
| 8,299,949 B2* | 10/2012 | Rofougaran | | H03M 1/186 |
| | | | | 341/155 |
| 8,618,876 B2 | 12/2013 | Deng et al. | | |
| 8,774,742 B2 | 7/2014 | Asuri et al. | | |
| 8,781,411 B2 | 7/2014 | Asuri et al. | | |
| 10,225,046 B2* | 3/2019 | Wang | | H04B 17/309 |
| 10,454,638 B2* | 10/2019 | Yan | | H04L 5/006 |
| 10,701,638 B2* | 6/2020 | Lee | | H04W 52/262 |
| 10,742,349 B2* | 8/2020 | Yeo | | H04W 28/18 |
| 11,102,676 B2* | 8/2021 | Khoshnevisan | | H04W 28/06 |
| 2005/0058057 A1* | 3/2005 | Maltsev | | H04L 5/006 |
| | | | | 370/203 |
| 2005/0152465 A1* | 7/2005 | Maltsev | | H04L 5/0046 |
| | | | | 375/260 |
| 2006/0165189 A1* | 7/2006 | Tamaki | | H04L 1/0007 |
| | | | | 375/260 |
| 2006/0165190 A1* | 7/2006 | Tamaki | | H04L 1/1671 |
| | | | | 375/262 |
| 2007/0099648 A1* | 5/2007 | Kim | | H04W 52/24 |
| | | | | 455/522 |
| 2007/0218863 A1* | 9/2007 | Futatsugi | | H04L 1/0003 |
| | | | | 455/403 |
| 2010/0233967 A1* | 9/2010 | Kim | | H04L 1/0023 |
| | | | | 455/67.13 |
| 2012/0320858 A1* | 12/2012 | Maru | | H04L 1/0003 |
| | | | | 370/329 |
| 2014/0119346 A1* | 5/2014 | Whitehead | | H04W 52/267 |
| | | | | 370/336 |
| 2014/0293811 A1* | 10/2014 | Rao | | H04B 17/309 |
| | | | | 370/252 |
| 2015/0085729 A1* | 3/2015 | Majjigi | | H04W 52/367 |
| | | | | 370/311 |
| 2015/0282208 A1 | 10/2015 | Yi et al. | | |
| 2015/0341867 A1* | 11/2015 | Lou | | H04W 74/006 |
| | | | | 370/329 |
| 2016/0127091 A1* | 5/2016 | Yan | | H04L 27/2614 |
| | | | | 370/329 |
| 2016/0226636 A1 | 8/2016 | Seo et al. | | |
| 2016/0241424 A1* | 8/2016 | Craninckx | | H04B 1/0475 |
| 2017/0135050 A1 | 5/2017 | Abraham et al. | | |
| 2017/0171859 A1 | 6/2017 | Nimbalker et al. | | |
| 2019/0028229 A1* | 1/2019 | Yeo | | H04L 1/0058 |
| 2019/0246378 A1* | 8/2019 | Islam | | H04W 72/042 |
| 2019/0261218 A1* | 8/2019 | Khoshnevisan | | H04W 28/06 |
| 2019/0342061 A1 | 11/2019 | Kim et al. | | |
| 2020/0068492 A1* | 2/2020 | Lee | | H04B 17/345 |
| 2020/0274635 A1* | 8/2020 | Chen | | H04L 1/0016 |
| 2020/0374163 A1* | 11/2020 | Zhao | | H04W 72/042 |
| 2021/0160826 A1* | 5/2021 | Bae | | H04L 1/0016 |
| 2021/0167906 A1* | 6/2021 | Sun | | H04B 7/0626 |
| 2021/0242958 A1* | 8/2021 | Gutman | | H03M 1/66 |
| 2021/0250871 A1* | 8/2021 | Rico Alvarino | | H04W 52/367 |

FOREIGN PATENT DOCUMENTS

| | | | | | |
|---|---|---|---|---|---|
| EP | | 2393329 A1 * | 12/2011 | | H04W 52/241 |
| EP | | 1704693 B1 * | 8/2018 | | H04L 1/0003 |
| EP | | 3737010 A1 * | 11/2020 | | H04L 1/00 |
| EP | | 3737010 A4 | 2/2021 | | H04L 27/183 |
| WO | WO-2005071912 A1 * | | 8/2005 | | H04L 1/0009 |
| WO | WO-2009028806 A2 * | | 3/2009 | | H04L 1/0003 |
| WO | WO-2010129820 A1 * | | 11/2010 | | H04L 1/0041 |
| WO | WO-2019017749 A1 * | | 1/2019 | | H04L 5/0053 |
| WO | WO-2019157671 A1 * | | 8/2019 | | H04W 72/042 |
| WO | WO-2019199070 A1 * | | 10/2019 | | H04L 1/001 |
| WO | WO-2020033968 A1 * | | 2/2020 | | H04L 1/0025 |

\* cited by examiner

DYNAMIC TRANSMISSION FRONT END AND DIGITAL-TO-ANALOG CONVERTER IN MODEM

FIELD OF TECHNOLOGY

The following relates generally to wireless communications and more specifically to a dynamic transmission front end and a dynamic digital-to-analog converter in a modem.

BACKGROUND

Wireless communications systems are widely deployed to provide various types of communication content such as voice, video, packet data, messaging, broadcast, and so on. These systems may be capable of supporting communication with multiple users by sharing the available system resources (for example, time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems (which may be referred to as New Radio (NR) systems). These systems may employ technologies such as code division multiple access (CDMA), time division multiple access (TDMA), frequency division multiple access (FDMA), orthogonal frequency division multiple access (OFDMA), or discrete Fourier transform spread orthogonal frequency division multiplexing (DFT-S-OFDM). A wireless multiple-access communications system may include one or more base stations or one or more network access nodes, each simultaneously supporting communication for multiple communication devices (which may be otherwise known as user equipment (UE)).

Performing wireless communications consumes power according to many factors including the capabilities or characteristics of components within a wireless modem of the UE used to generate and transmit the wireless communications. Consuming power at a higher rate may increase a rate at which a battery of the UE is depleted and may decrease an amount of power that the UE may direct to performing other operations while performing the wireless communications. As such, techniques to decrease power consumption may enable the UE to operate more efficiently.

SUMMARY

The described techniques relate to improved methods, systems, devices, and apparatuses that support a dynamic transmission front end (TxFE) and a dynamic digital-to-analog converter (DAC) in a modem. Generally, the described techniques provide for a user equipment (UE) to receive a downlink control message from a base station indicating information, such as a modulation and coding scheme (MCS) associated with an uplink transmission, a number of layers associated with the uplink transmission, or both. The UE may determine to adjust a first number of bits supported by one or more components based on the MCS, or the number of layers, or both. In some examples, the first number of bits may include an effective number of bits (ENOB) supported at a DAC of the UE, a number of bits (NOB) supported at a TxFE component of the UE, or both. The UE may transmit the uplink transmission to the base station according to the adjusted first number of bits. By reducing the ENOB supported at the DAC, the NOB supported at the TxFE component, or both, the UE may reduce power consumption, among other advantages.

A method for wireless communication at a UE is described. The method may include receiving a downlink control message including at least one of a MCS associated with at least one uplink transmission or a number of layers associated with the at least one uplink transmission, determining to reduce a first number of bits based on the at least one of the MCS or the number of layers, where the first number of bits includes at least one of an ENOB supported at a DAC of the UE or an NOB supported at a TxFE component of the UE, and transmitting the at least one uplink transmission according to the adjusted first number of bits.

An apparatus for wireless communication at a UE is described. The apparatus may include a processor, memory in electronic communication with the processor, and instructions stored in the memory. The instructions may be executable by the processor to cause the apparatus to receive a downlink control message including at least one of a MCS associated with at least one uplink transmission or a number of layers associated with the at least one uplink transmission, determine to adjust a first number of bits based on the at least one of the MCS or the number of layers, where the first number of bits includes at least one of an ENOB supported at a DAC of the UE or an NOB supported at a TxFE component of the UE, and transmit the at least one uplink transmission according to the adjusted first number of bits.

Another apparatus for wireless communication at a UE is described. The apparatus may include means for receiving a downlink control message including at least one of a MCS associated with at least one uplink transmission or a number of layers associated with the at least one uplink transmission, means for determining to adjust a first number of bits based on the at least one of the MCS or the number of layers, where the first number of bits includes at least one of an ENOB supported at a DAC of the UE or an NOB supported at a TxFE component of the UE, and means for transmitting the at least one uplink transmission according to the adjusted first number of bits.

A non-transitory computer-readable medium storing code for wireless communication at a UE is described. The code may include instructions executable by a processor to receive a downlink control message including at least one of a MCS associated with at least one uplink transmission or a number of layers associated with the at least one uplink transmission, determine to adjust a first number of bits based on the at least one of the MCS or the number of layers, where the first number of bits includes at least one of an ENOB supported at a DAC of the UE or an NOB supported at a TxFE component of the UE, and transmit the at least one uplink transmission according to the adjusted first number of bits.

Some examples of the method, apparatuses, and non-transitory computer-readable medium described herein may further include operations, features, means, or instructions for determining to adjust a power consumption level of the UE, where determining to adjust the first number of bits may be based on determining to adjust the power consumption level, and adjusting the power consumption level of the UE based on determining to adjust the power consumption level, where transmitting the at least one uplink transmission may be based on adjusting the power consumption level.

In some examples of the method, apparatuses, and non-transitory computer-readable medium described herein, determining to adjust the first number of bits may include operations, features, means, or instructions for determining to adjust the ENOB supported at the DAC, and determining to adjust the NOB supported at the TxFE component.

Some examples of the method, apparatuses, and non-transitory computer-readable medium described herein may further include operations, features, means, or instructions for transmitting the at least one uplink transmission may be based on adjusting the power consumption level.

In some examples of the method, apparatuses, and non-transitory computer-readable medium described herein, a second number of bits adjusted from the ENOB supported at the DAC may be the same as a third number of bits adjusted from the NOB supported at the TxFE component.

Some examples of the method, apparatuses, and non-transitory computer-readable medium described herein may further include operations, features, means, or instructions for determining to adjust the first number of bits includes determining, based on the at least one of the MCS or the number of layers, a second number of bits by which to adjust the ENOB supported at the DAC and a third number of bits by which to adjust the NOB supported at the TxFE component.

In some examples of the method, apparatuses, and non-transitory computer-readable medium described herein, determining the second number of bits and the third number of bits may include operations, features, means, or instructions for retrieving the second number of bits and the third number of bits based on the one or more of the MCS or the number of layers.

Some examples of the method, apparatuses, and non-transitory computer-readable medium described herein may further include operations, features, means, or instructions for determining to adjust the first number of bits may be based on the determining.

In some examples of the method, apparatuses, and non-transitory computer-readable medium described herein, receiving the downlink control message may include operations, features, means, or instructions for receiving downlink control information indicating the at least one of the MCS or the number of layers.

In some examples of the method, apparatuses, and non-transitory computer-readable medium described herein, one or more bits adjusted from the first number of bits may be least significant bits of the first number of bits.

Some examples of the method, apparatuses, and non-transitory computer-readable medium described herein may further include operations, features, means, or instructions for determining to adjust the first number of bits may be based on the at least one uplink transmission including a millimeter-wave transmission.

Some examples of the method, apparatuses, and non-transitory computer-readable medium described herein may further include operations, features, means, or instructions for determining to adjust the first number of bits may be based on the at least one uplink transmission including a sub-6 gigahertz transmission.

In some examples of the method, apparatuses, and non-transitory computer-readable medium described herein, the ENOB includes a second number of bits associated with a resolution of the DAC, and where the ENOB may be less than the second number of bits associated with the resolution of the DAC.

A method for wireless communication at a base station is described. The method may include establishing a communication link with a UE, transmitting, to the UE, a downlink control message including at least one of a MCS associated with at least one uplink transmission or a number of layers associated with the at least one uplink transmission, where the at least one of the MCS or the number of layers indicate to adjust a first number of bits, where the first number of bits include at least one of an ENOB supported at a DAC of the UE or a NOB supported at a TxFE component of the UE, and receiving, from the UE, the at least one uplink transmission based on the at least one of the MCS or the number of layers indicating to adjust the first number of bits.

An apparatus for wireless communication at a base station is described. The apparatus may include a processor, memory in electronic communication with the processor, and instructions stored in the memory. The instructions may be executable by the processor to cause the apparatus to establish a communication link with a UE, transmit, to the UE, a downlink control message including at least one of a MCS associated with at least one uplink transmission or a number of layers associated with the at least one uplink transmission, where the at least one of the MCS or the number of layers indicate to adjust a first number of bits, where the first number of bits include at least one of an ENOB supported at a DAC of the UE or a NOB supported at a TxFE component of the UE, and receive, from the UE, the at least one uplink transmission based on the at least one of the MCS or the number of layers indicating to adjust the first number of bits.

Another apparatus for wireless communication at a base station is described. The apparatus may include means for establishing a communication link with a UE, means for transmitting, to the UE, a downlink control message including at least one of a MCS associated with at least one uplink transmission or a number of layers associated with the at least one uplink transmission, where the at least one of the MCS or the number of layers indicate to adjust a first number of bits, where the first number of bits include at least one of an ENOB supported at a DAC of the UE or a NOB supported at a TxFE component of the UE, and means for receiving, from the UE, the at least one uplink transmission based on the at least one of the MCS or the number of layers indicating to adjust the first number of bits.

A non-transitory computer-readable medium storing code for wireless communication at a base station is described. The code may include instructions executable by a processor to establish a communication link with a UE, transmit, to the UE, a downlink control message including at least one of a MCS associated with at least one uplink transmission or a number of layers associated with the at least one uplink transmission, where the at least one of the MCS or the number of layers indicate to adjust a first number of bits, where the first number of bits include at least one of an ENOB supported at a DAC of the UE or an NOB supported at a TxFE component of the UE, and receive, from the UE, the at least one uplink transmission based on the at least one of the MCS or the number of layers indicating to adjust the first number of bits.

Some examples of the method, apparatuses, and non-transitory computer-readable medium described herein may further include determining that a signal to noise ratio (SNR) associated with a transmission of the UE is above a threshold amount and transmitting the downlink control message based at least in part on the determining.

In some examples of the method, apparatuses, and non-transitory computer-readable medium described herein, the at least one of the MCS or the number of layers indicate a second number of bits by which to adjust the ENOB supported at the DAC and a third number of bits by which to adjust the NOB supported at the TxFE component.

In some examples of the method, apparatuses, and non-transitory computer-readable medium described herein, the ENOB includes a second number of bits associated with a resolution of the DAC, and where the ENOB may be less than the second number of bits associated with the resolution of the DAC.

DETAILED DESCRIPTION

Figure 1:
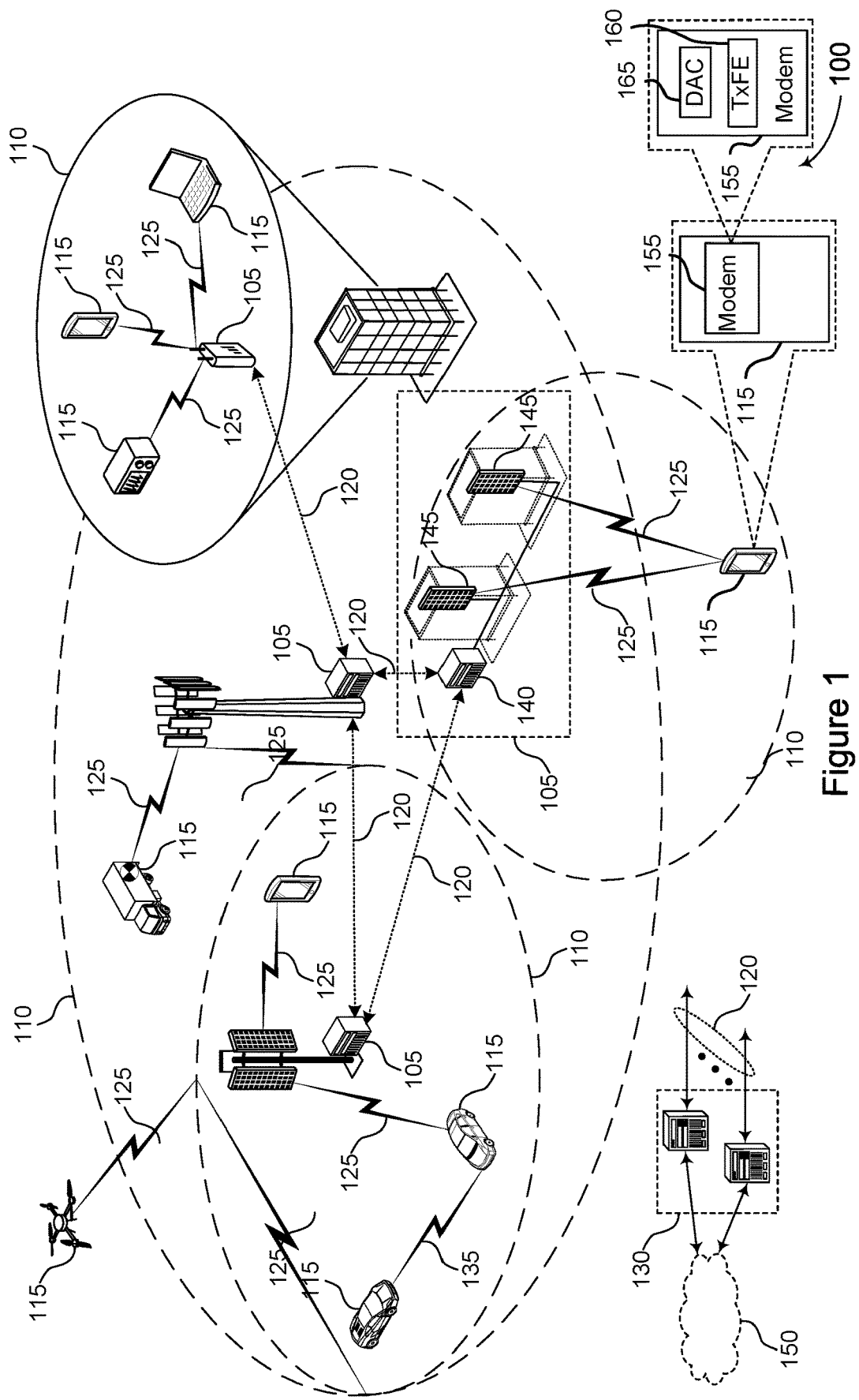
FIG. 1 illustrates an example of a wireless communications system that supports a dynamic transmission front end (TxFE) and a dynamic digital-to-analog converter (DAC) in a modem in accordance with aspects of the present disclosure.

In some examples, a user equipment (UE) operating under different conditions (for example, different locations within a cell) may experience varying degrees of interference. In response, a UE may transmit signals using a relatively high modulation and coding scheme (MCS) associated with a relatively high signal power which may lead to the UE consuming more power. One cause of consuming more power can be due to the UE including devices (for example, a modem) that include components (for example, a digital-to-analog converter (DAC) or a transmission front end (TxFE)) supporting operations using a greater number of bits to achieve a greater signal to noise ratio (SNR). In some other systems, a UE may be configured to support relatively high MCSs and may operate using a relatively high number of bits regardless of channel conditions (for example, the number of bits may be fixed). But components that enable using a relatively high number of bits or a high SNR regardless of channel conditions may cause the total power consumption of the modem (which may also be referred to as a transmission modem) to be greater than an amount that would still have enabled a base station to successfully receive and decode transmissions from the UE. For example, for millimeter wave (mmW) 5G systems, the base station may receive and decode a transmission with a relatively low SNR (for example, due to using a low or middle-valued MCS). In such cases, using a relatively high number of bits may cause the modem to consume more power than desirable or necessary without substantially increasing a likelihood that the base station will successfully receive and decode the transmission.

In some aspects, a UE may be configured to implement a power utilization (or power consumption) mode scheme such that the UE may dynamically adjust the number of bits enabled by one or more components. For example, the UE may dynamically disable at least some bits supported by one or more components (for example, a DAC or other component in a TxFE) of the UE to save power. In some examples, the UE may be configured to switch among multiple power consumption modes. Each mode may be associated with a number of supported or disabled bits at one or more components and an amount of power consumed or saved at the components. A device operating under a lower power consumption mode may use an adjusted number of bits and may consume less power than when operating under a higher power consumption mode that uses a greater number of bits.

In some examples, the UE may dynamically adjust the number of bits supported by one or more components based on receiving downlink control information (DCI) from the base station. The DCI may indicate an MCS associated with one or more uplink transmissions, or a number of layers associated with one or more uplink transmissions, or both. In some examples, a UE may be preconfigured with an association between one or more MCSs, one or more numbers of layers, and numbers of supported or dropped bits for one or more components (for example, a DAC or other component within a TxFE). In some examples, the UE may determine the bits that are disabled (for example, turned off) based on the relative significance of bits at each component. For example, a base station may configure the UE to disable, using hardware or software or both, at least some of the least significant bits (LSBs) used by one or more components of the TxFE. In some examples, the UE may disable some number of bits for one component and a different number of bits for a different component (for example, a different number of bits for a DAC versus another component in a TxFE). In some examples, the UE may disable the same number of bits for multiple components. In some other examples, the UE may disable some number of bits for each of one of more components of a set of components such that each component of the set of components such that each component of the set of components uses the same number of bits. For example, if a DAC of the UE uses 12 bits and another component in the TxFE uses 13 bits, the UE may disable 4 bits for the DAC and 5 bits for the other component in the TxFE.

FIG. 1 illustrates an example of a wireless communications system 100 that supports a dynamic TxFE and a dynamic DAC in a modem in accordance with aspects of the present disclosure. The wireless communications system 100 may include one or more base stations 105, one or more UEs 115, and a core network 130. In some examples, the wireless communications system 100 may be a Long Term Evolution (LTE) network, an LTE-Advanced (LTE-A) network, an LTE-A Pro network, or a New Radio (NR) network. In some examples, the wireless communications system 100 may support enhanced broadband communications, ultra-reliable (for example, mission critical) communications, low latency communications, communications with low-cost and low-complexity devices, or any combination thereof.

The base stations 105 may be dispersed throughout a geographic area to form the wireless communications system 100 and may be devices in different forms or having different capabilities. The base stations 105 and the UEs 115 may wirelessly communicate via one or more communication links 125. Each base station 105 may provide a coverage area 110 over which the UEs 115 and the base station 105 may establish one or more communication links 125. The coverage area 110 may be an example of a geographic area over which a base station 105 and a UE 115 may support the communication of signals according to one or more radio access technologies.

The UEs 115 may be dispersed throughout a coverage area 110 of the wireless communications system 100, and each UE 115 may be stationary, or mobile, or both at different times. The UEs 115 may be devices in different forms or having different capabilities. Some example UEs 115 are illustrated with reference to FIG. 1. The UEs 115 described herein may be able to communicate with various types of devices, such as other UEs 115, the base stations 105, or network equipment (for example, core network nodes, relay devices, integrated access and backhaul (IAB) nodes, or other network equipment), as shown in FIG. 1.

The base stations 105 may communicate with the core network 130, or with one another, or both. For example, the base stations 105 may interface with the core network 130 through one or more backhaul links 120 (for example, via an S1, N2, N3, or other interface). The base stations 105 may communicate with one another over the backhaul links 120 (for example, via an X2, Xn, or other interface) either directly (for example, directly between base stations 105), or indirectly (for example, via core network 130), or both. In some examples, the backhaul links 120 may be or include one or more wireless links.

One or more of the base stations 105 described herein may include or may be referred to by a person having ordinary skill in the art as a base transceiver station, a radio base station, an access point, a radio transceiver, a NodeB, an eNodeB (eNB), a next-generation NodeB or a giga-NodeB (either of which may be referred to as a gNB), a Home NodeB, a Home eNodeB, or other suitable terminology.

A UE 115 may include or may be referred to as a mobile device, a wireless device, a remote device, a handheld device, or a subscriber device, or some other suitable terminology. The "device" may also be referred to as a unit, a station, a terminal, or a client, among other examples. A UE 115 may also include or may be referred to as a personal electronic device such as a cellular phone, a personal digital assistant (PDA), a tablet computer, a laptop computer, or a personal computer. In some examples, a UE 115 may include or be referred to as a wireless local loop (WLL) station, an Internet of Things (IoT) device, an Internet of Everything (IoE) device, or a machine type communications (MTC) device, among other examples, which may be implemented in various objects such as appliances, or vehicles, meters, among other examples.

The UEs 115 described herein may be able to communicate with various types of devices, such as other UEs 115 that may sometimes act as relays as well as the base stations 105 and the network equipment including macro eNBs or gNBs, small cell eNBs or gNBs, or relay base stations, among other examples, as shown in FIG. 1.

The UEs 115 and the base stations 105 may wirelessly communicate with one another via one or more communication links 125 over one or more carriers. The term "carrier" may refer to a set of radio frequency spectrum resources having a defined physical layer structure for supporting the communication links 125. For example, a carrier used for a communication link 125 may include a portion of a radio frequency spectrum band (for example, a bandwidth part (BWP)) that is operated according to one or more physical layer channels for a given radio access technology (for example, LTE, LTE-A, LTE-A Pro, NR). Each physical layer channel may carry acquisition signaling (for example, synchronization signals, system information), control signaling that coordinates operation for the carrier, user data, or other signaling. The wireless communications system 100 may support communication with a UE 115 using carrier aggregation or multi-carrier operation. A UE 115 may be configured with multiple downlink component carriers and one or more uplink component carriers according to a carrier aggregation configuration. Carrier aggregation may be used with both frequency division duplexing (FDD) and time division duplexing (TDD) component carriers.

Signal waveforms transmitted over a carrier may be made up of multiple subcarriers (for example, using multi-carrier modulation (MCM) techniques such as orthogonal frequency division multiplexing (OFDM) or discrete Fourier transform spread OFDM (DFT-S-OFDM)). In a system employing MCM techniques, a resource element may consist of one symbol period (for example, a duration of one modulation symbol) and one subcarrier. The symbol period and subcarrier spacing may be inversely related. The number of bits carried by each resource element may depend on the modulation scheme (for example, the order of the modulation scheme, the coding rate of the modulation scheme, or both). Thus, the more resource elements that a UE 115 receives and the higher the order of the modulation scheme, the higher the data rate may be for the UE 115. A wireless communications resource may refer to a combination of a radio frequency spectrum resource, a time resource, and a spatial resource (for example, spatial layers or beams), and the use of multiple spatial layers may further increase the data rate or data integrity for communications with a UE 115.

The time intervals for the base stations 105 or the UEs 115 may be expressed in multiples of a basic time unit which may, for example, refer to a sampling period of $T_s=1/(\Delta f_{max} \cdot N_f)$ seconds. $\Delta f_{max}$ may represent the maximum supported subcarrier spacing, and $N_f$ may represent the maximum supported discrete Fourier transform (DFT) size. Time intervals of a communications resource may be organized according to radio frames each having a specified duration (for example, 10 milliseconds (ms)). Each radio frame may be identified by a system frame number (SFN) (for example, ranging from 0 to 1023).

Each frame may include multiple consecutively numbered subframes or slots, and each subframe or slot may have the same duration. In some examples, a frame may be divided (for example, in the time domain) into subframes, and each subframe may be further divided into a number of slots. Alternatively, each frame may include a variable number of slots, and the number of slots may depend on subcarrier spacing. Each slot may include a number of symbol periods (for example, depending on the length of the cyclic prefix prepended to each symbol period). In some wireless communications systems 100, a slot may further be divided into multiple mini-slots containing one or more symbols. Excluding the cyclic prefix, each symbol period may contain one or more (for example, $N_f$) sampling periods. The duration of a symbol period may depend on the subcarrier spacing or frequency band of operation.

A subframe, a slot, a mini-slot, or a symbol may be the smallest scheduling unit (for example, in the time domain) of the wireless communications system 100 and may be referred to as a transmission time interval (TTI). In some examples, the TTI duration (for example, the number of symbol periods in a TTI) may be variable. Additionally or alternatively, the smallest scheduling unit of the wireless communications system 100 may be dynamically selected (for example, in bursts of shortened TTIs (sTTIs)).

Physical channels may be multiplexed on a carrier according to various techniques. A physical control channel and a physical data channel may be multiplexed on a downlink carrier, for example, using one or more of time division multiplexing (TDM) techniques, frequency division multiplexing (FDM) techniques, or hybrid TDM-FDM techniques. A control region (for example, a control resource set (CORESET)) for a physical control channel may be defined by a number of symbol periods and may extend across the system bandwidth or a subset of the system bandwidth of the carrier. One or more control regions (for example, CORESETs) may be configured for a set of the UEs 115. For example, one or more of the UEs 115 may monitor or search control regions for control information according to one or more search space sets, and each search space set may include one or multiple control channel candidates in one or more aggregation levels arranged in a cascaded manner. An aggregation level for a control channel candidate may refer to a number of control channel resources (for example, control channel elements (CCEs)) associated with encoded information for a control information format having a given payload size. Search space sets may include common search space sets configured for sending control information to multiple UEs 115 and UE-specific search space sets for sending control information to a specific UE 115.

In some examples, a base station 105 may be movable and therefore provide communication coverage for a moving geographic coverage area 110. In some examples, different geographic coverage areas 110 associated with different technologies may overlap, but the different geographic coverage areas 110 may be supported by the same base station 105. In other examples, the overlapping geographic coverage areas 110 associated with different technologies may be supported by different base stations 105. The wireless communications system 100 may include, for example, a heterogeneous network in which different types of the base stations 105 provide coverage for various geographic coverage areas 110 using the same or different radio access technologies.

Some UEs 115 may be configured to employ operating modes that reduce power consumption, such as half-duplex communications (for example, a mode that supports one-way communication via transmission or reception, but not transmission and reception simultaneously). In some examples, half-duplex communications may be performed at a reduced peak rate. Other power conservation techniques for the UEs 115 include entering a power saving deep sleep mode when not engaging in active communications, operating over a limited bandwidth (for example, according to narrowband communications), or a combination of these techniques. For example, some UEs 115 may be configured for operation using a narrowband protocol type that is associated with a defined portion or range (for example, set of subcarriers or resource blocks (RBs)) within a carrier, within a guard-band of a carrier, or outside of a carrier.

The wireless communications system 100 may be configured to support ultra-reliable communications or low-latency communications, or various combinations thereof. For example, the wireless communications system 100 may be configured to support ultra-reliable low-latency communications (URLLC) or mission critical communications. The UEs 115 may be designed to support ultra-reliable, low-latency, or critical functions (for example, mission critical functions). Ultra-reliable communications may include private communication or group communication and may be supported by one or more mission critical services such as mission critical push-to-talk (MCPTT), mission critical video (MCVideo), or mission critical data (MCData). Support for mission critical functions may include prioritization of services, and mission critical services may be used for public safety or general commercial applications. The terms ultra-reliable, low-latency, mission critical, and ultra-reliable low-latency may be used interchangeably herein.

In some examples, a UE 115 may also be able to communicate directly with other UEs 115 over a device-to-device (D2D) communication link 135 (for example, using a peer-to-peer (P2P) or D2D protocol). One or more UEs 115 utilizing D2D communications may be within the geographic coverage area 110 of a base station 105. Other UEs 115 in such a group may be outside the geographic coverage area 110 of a base station 105 or be otherwise unable to receive transmissions from a base station 105. In some examples, groups of the UEs 115 communicating via D2D communications may utilize a one-to-many (1:M) system in which each UE 115 transmits to every other UE 115 in the group. In some examples, a base station 105 facilitates the scheduling of resources for D2D communications. In other cases, D2D communications are carried out between the UEs 115 without the involvement of a base station 105.

The core network 130 may provide user authentication, access authorization, tracking, Internet Protocol (IP) connectivity, and other access, routing, or mobility functions. The core network 130 may be an evolved packet core (EPC) or 5G core (5GC), which may include at least one control plane entity that manages access and mobility (for example, a mobility management entity (MME), an access and mobility management function (AMF)) and at least one user plane entity that routes packets or interconnects to external networks (for example, a serving gateway (S-GW), a Packet Data Network (PDN) gateway (P-GW), or a user plane function (UPF)). The control plane entity may manage non-access stratum (NAS) functions such as mobility, authentication, and bearer management for the UEs 115 served by the base stations 105 associated with the core network 130. User IP packets may be transferred through the user plane entity, which may provide IP address allocation as well as other functions. The user plane entity may be connected to the network operators IP services 150. The operators IP services 150 may include access to the Internet, Intranet(s), an IP Multimedia Subsystem (IMS), or a Packet-Switched Streaming Service.

Some of the network devices, such as a base station 105, may include subcomponents such as an access network entity 140, which may be an example of an access node controller (ANC). Each access network entity 140 may communicate with the UEs 115 through one or more other access network transmission entities 145, which may be referred to as radio heads, smart radio heads, or transmission/reception points (TRPs). Each access network transmission entity 145 may include one or more antenna panels.

In some configurations, various functions of each access network entity 140 or base station 105 may be distributed across various network devices (for example, radio heads and ANCs) or consolidated into a single network device (for example, a base station 105).

The wireless communications system 100 may operate using one or more frequency bands, typically in the range of 300 megahertz (MHz) to 300 gigahertz (GHz). Generally, the region from 300 MHz to 3 GHz is known as the ultra-high frequency (UHF) region or decimeter band because the wavelengths range from approximately one decimeter to one meter in length. The UHF waves may be blocked or redirected by buildings and environmental features, but the waves may penetrate structures sufficiently for a macro cell to provide service to the UEs 115 located indoors. The transmission of UHF waves may be associated with smaller antennas and shorter ranges (for example, less than 100 kilometers) compared to transmission using the smaller frequencies and longer waves of the high frequency (HF) or very high frequency (VHF) portion of the spectrum below 300 MHz.

The wireless communications system 100 may also operate in a super high frequency (SHF) region using frequency bands from 3 GHz to 30 GHz, also known as the centimeter band, or in an extremely high frequency (EHF) region of the spectrum (for example, from 30 GHz to 300 GHz), also known as the millimeter band. In some examples, the wireless communications system 100 may support millimeter wave (mmW) communications between the UEs 115 and the base stations 105, and EHF antennas of the respective devices may be smaller and more closely spaced than UHF antennas. In some examples, this may facilitate use of antenna arrays within a device. The propagation of EHF transmissions, however, may be subject to even greater atmospheric attenuation and shorter range than SHF or UHF transmissions. The techniques disclosed herein may be employed across transmissions that use one or more different frequency regions, and designated use of bands across these frequency regions may differ by country or regulating body.

The wireless communications system 100 may utilize both licensed and unlicensed radio frequency spectrum bands. For example, the wireless communications system 100 may employ License Assisted Access (LAA), LTE-Unlicensed (LTE-U) radio access technology, or NR technology in an unlicensed band such as the 5 GHz industrial, scientific, and medical (ISM) band. When operating in unlicensed radio frequency spectrum bands, devices such as the base stations 105 and the UEs 115 may employ carrier sensing for collision detection and avoidance. In some examples, operations in unlicensed bands may be based on a carrier aggregation configuration in conjunction with component carriers operating in a licensed band (for example, LAA). Operations in unlicensed spectrum may include downlink transmissions, uplink transmissions, P2P transmissions, or D2D transmissions, among other examples.

A base station 105 or a UE 115 may be equipped with multiple antennas, which may be used to employ techniques such as transmit diversity, receive diversity, multiple-input multiple-output (MIMO) communications, or beamforming. The antennas of a base station 105 or a UE 115 may be located within one or more antenna arrays or antenna panels, which may support MIMO operations or transmit or receive beamforming. For example, one or more base station antennas or antenna arrays may be co-located at an antenna assembly, such as an antenna tower. In some examples, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations. Additionally or alternatively, an antenna panel may support radio frequency beamforming for a signal transmitted via an antenna port.

Beamforming (which may also be referred to as spatial filtering, directional transmission, or directional reception) is a signal processing technique that may be used at a transmitting device or a receiving device (for example, a base station 105, a UE 115) to shape or steer an antenna beam (for example, a transmit beam, a receive beam) along a spatial path between the transmitting device and the receiving device. Beamforming may be achieved by combining the signals communicated via antenna elements of an antenna array such that some signals propagating at particular orientations with respect to an antenna array experience constructive interference while others experience destructive interference. The adjustment of signals communicated via the antenna elements may include a transmitting device or a receiving device applying amplitude offsets, phase offsets, or both to signals carried via the antenna elements associated with the device. The adjustments associated with each of the antenna elements may be defined by a beamforming weight set associated with a particular orientation (for example, with respect to the antenna array of the transmitting device or receiving device, or with respect to some other orientation).

Wireless communications systems are widely deployed to provide various types of communication content such as voice, video, packet data, messaging, broadcast, and so on. These systems may be multiple-access systems capable of supporting communication with multiple users by sharing the available system resources (for example, time, frequency, and power). A wireless network, for example a wireless local area network (WLAN), such as a Wi-Fi (in other words, Institute of Electrical and Electronics Engineers (IEEE) 802.11) network may include an access point (AP) that may communicate with one or more wireless or mobile devices. The AP may be coupled to a network, such as the Internet, and may enable a mobile device to communicate via the network (or communicate with other devices coupled to the access point). A wireless device may communicate with a network device bi-directionally. For example, in a WLAN, a device may communicate with an associated AP via downlink (for example, the communication link from the AP to the device) and uplink (for example, the communication link from the device to the AP). A wireless personal area network (PAN), which may include a Bluetooth connection, may provide for short range wireless connections between two or more paired wireless devices. For example, wireless devices such as cellular phones may utilize wireless PAN communications to exchange information such as audio signals with wireless headsets.

In some examples, a UE 115 may receive a downlink control message from a base station 105 comprising downlink control information indicating an MCS associated with an uplink transmission, a number of layers associated with the uplink transmission, or both, among other examples. The UE 115 may determine to adjust (for example, reduce) a first number of bits supported by one or more components of the UE (for example, at a modem 155 of the UE 115) based on the MCS, the number of layers, or both, among other aspects. The first number of bits may include an effective number of bits (ENOB) supported at a DAC 165 of the UE 115, a number of bits (NOB) supported at a TxFE component 160 of the UE 115, or both, among other examples. Based on reducing the first number of bits supported by the one or more components of the UE, the UE 115 may transmit the uplink transmission to the base station 105 according to the adjusted first number of bits. By adjusting (for example, reducing) the ENOB supported at the DAC 165, the NOB supported at the TxFE component 160, or both, the UE 115 may adjust (for example, reduce) power consumption, among other advantages. Adjusting (for example, reducing) the ENOB, the NOB, or both, may adjust (for example, reduce) power consumption by limiting a resolution of the DAC 165, the TxFE component 160, or both, respectively, such that the DAC 165, the TxFE component 160, or both, do not generate signals associated with high SNRs, which may involve the DAC, the TxFE, or both, consuming more power than when generating signals associated with low or middle-valued SNRs.

Figure 2:
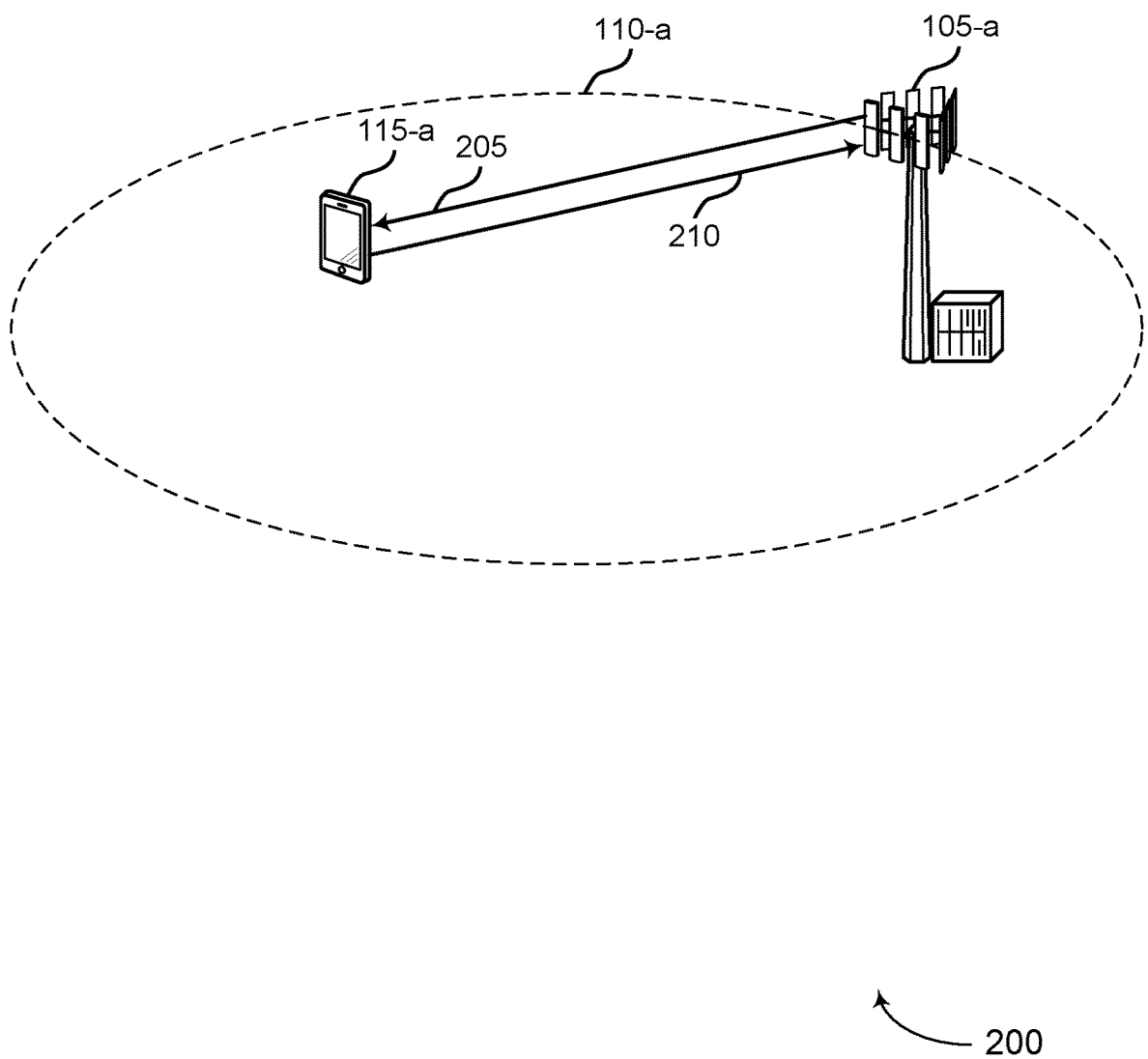
FIG. 2 illustrates an example of a wireless communications system that supports a dynamic TxFE and a dynamic DAC in a modem in accordance with aspects of the present disclosure.

FIG. 2 illustrates an example of a wireless communications system 200 that supports a dynamic TxFE and a dynamic DAC in a modem in accordance with aspects of the present disclosure. In some examples, the wireless communications system 200 may implement aspects of the wireless communications system 100. For example, a base station 105-*a* may be an example of a base station 105 as described with reference to FIG. 1 and a UE 115-*a* may be an example of a UE 115 as described with reference to FIG. 1.

In some examples, the UE 115-*a* and the base station 105-*a* may be configured to perform mmW communications. The bandwidth over which mmW communications is performed may be larger (for example, ~5-10 times larger or more) compared to LTE or sub-6 GHz communications. Due to the relatively high bandwidth used for mmW communications relative to LTE or sub-6 GHz communications, components of a modem or modem-related block of the UE 115-*a* may consume relatively more power for mmW communications. In some examples, a DAC of the UE 115-*a* with a relatively high ENOB enabled may consume approximately 4 percent of the modem's power in a full component carrier mode. In some examples, the TxFE of the modem or modem-related block with a relatively high NOB enabled may consume approximately 20 to 25 percent of the modem's power in a full component carrier mode. Examples of a TxFE and a DAC are further described with reference to FIG. 3.

When performing mmW communications, the MCS may be the same for codewords in a given slot. Additionally, the UE 115-*a* may determine the MCS before, for example, one or more slots in advance of, transmitting an uplink transmission. In some examples, if the UE 115-*a* is positioned at or near a cell edge (for example, within coverage area 110-*a* if coverage area 110-*a* is a coverage area 110 of a cell), the MCS used for transmitting uplink transmissions from the UE 115-*a* may be a relatively lower value or a relatively intermediate value and may thus correspond to a relatively lower SNR value or a relatively intermediate SNR value, respectively. For example, in most cases, for a UE 115 at or near the cell edge (for example, approximately 90 percent of cases), the SNR may be at a relatively lower value or a relatively intermediate value (for example, the SNR may be less than approximately 20 dB, and in some examples, at a value between approximately 5 dB and approximately 15 dB).

The DAC of the UE 115-*a*, a component of the TxFE of the UE 115-*a* (for example, a time division digital processing component), or both may be capable of maintaining high SNRs (for example, approximately 40 dB) to account for specific cases in which a relatively high SNR may aid communications (for example, extreme boosting within a component carrier, extreme de-boosting within a component carrier, or cross-component-carrier attenuation). In such cases, the component of the TxFE may have a relatively high NOB enabled (for example, an NOB value in the range of 14 to 16 bits). In some situations (for example, situations involving MCS having a relatively lower value or a relatively intermediate value), however, maintaining a relatively high SNR may lead to the modem of the UE 115-*a* consuming more power without substantially increasing the efficiency or the efficacy of communications. For example, the base station 105-*a* may receive and successfully decode a transmission from the UE 115-*a* in instances in which the transmission has an associated SNR of 16 dB or more. As such, transmitting the transmission at an SNR of 40 dB consumes excess power unnecessarily, because the base station 105-*a* may have received and successfully decoded the transmission if it had been transmitted at an SNR of as little as 16 dB. In some aspects, dynamically adjusting the power or SNR associated with one or components of a modem for uplink communications can improve power usage.

To enable the UE 115-*a* to adjust the power consumption and the SNR according to the MCS or the number of layers, the ENOB of the DAC, the NOB of the component of the TxFE, or both, may be adjusted in real time (or approximately, effectively or essentially real time). Adjusting one or both of the ENOB or the NOB may save power at the modem of the UE 115-*a*. In some examples, one or more of the LSBs at the component of the TxFE or DAC may be disabled, which may reduce the NOB or the ENOB, respectively. As described in further detail with reference to FIG. 3, the ENOB or NOB may be controllable by hardware, which may in turn be controllable by radio-frequency (RF) software.

To indicate the MCS, the number of layers, or both, the base station 105-*a* may transmit a downlink control message 205 to the UE 115-*a*. The downlink control message 205 may, for example, include DCI. The UE 115-*a* may determine the MCS, the number of layers, or both from the downlink control message 205 based on analyzing the information indicated in or contained in the DCI itself or reutilizing information indicated by a previously received DCI. The UE 115-*a* may then determine to adjust an ENOB supported at the DAC, an NOB supported at the component of the TxFE, or both, based on the determination of the MCS, the number of layers, or both. In some examples, the UE 115-*a* may disable a first number of bits (for example, one or more LSBs) supported by the DAC, a second number of bits (for example, one or more LSBs) supported by the component of the TxFE, or both. Disabling one or both of the first number or the second number of bits may reduce the ENOB supported at the DAC, the NOB supported at the component of the TxFE, or both, respectively. Reducing the ENOB, the NOB, or both, may limit a resolution of the DAC, the component of the TxFE, or both, respectively, such that the DAC, the component of the TxFE, or both, do not generate signals associated with high SNRs. Generating signals with high SNRs may involve the DAC, the component of the TxFE, or both, consuming more power than when generating signals associated with low or middle-valued SNRs. As a result, by reducing the ENOB, the NOB, or both, the UE 115-*a* may dynamically and efficiently adjust its power consumption level. The UE 115-*a*, upon reducing the ENOB, the NOB, or both, may transmit an uplink transmission 210 to the base station 105-*a*.

In some cases, the UE 115-*a* may increase the ENOB supported at the DAC, the NOB supported at the TxFE, or both. For instance, the UE 115-*a* may enable a first number of bits (for example, one or more LSBs) supported at the DAC, a second number of bits (for example, one or more LSBs) supported by the component of the TxFE, or both. Increasing the ENOB, the NOB, or both, may increase a resolution of the DAC, the component of the TxFE, or both such that the DAC, the component of the TxFE, or both are capable of generating signals associated with higher SNRs.

Dynamically adjusting the ENOB, the NOB, or both according to an MCS, a number of layers, or both may have several advantages. For example, performing the dynamic adjusting may enable a modem of the UE 115-*a* to consume less power. Consuming less power may enable a battery of the UE 115-*a* to be depleted at a slower rate. Additionally or alternatively, consuming less power may enable the UE 115-*a* to use the power saved based on the dynamic adjustment for other operations, among other advantages.

Figure 3:
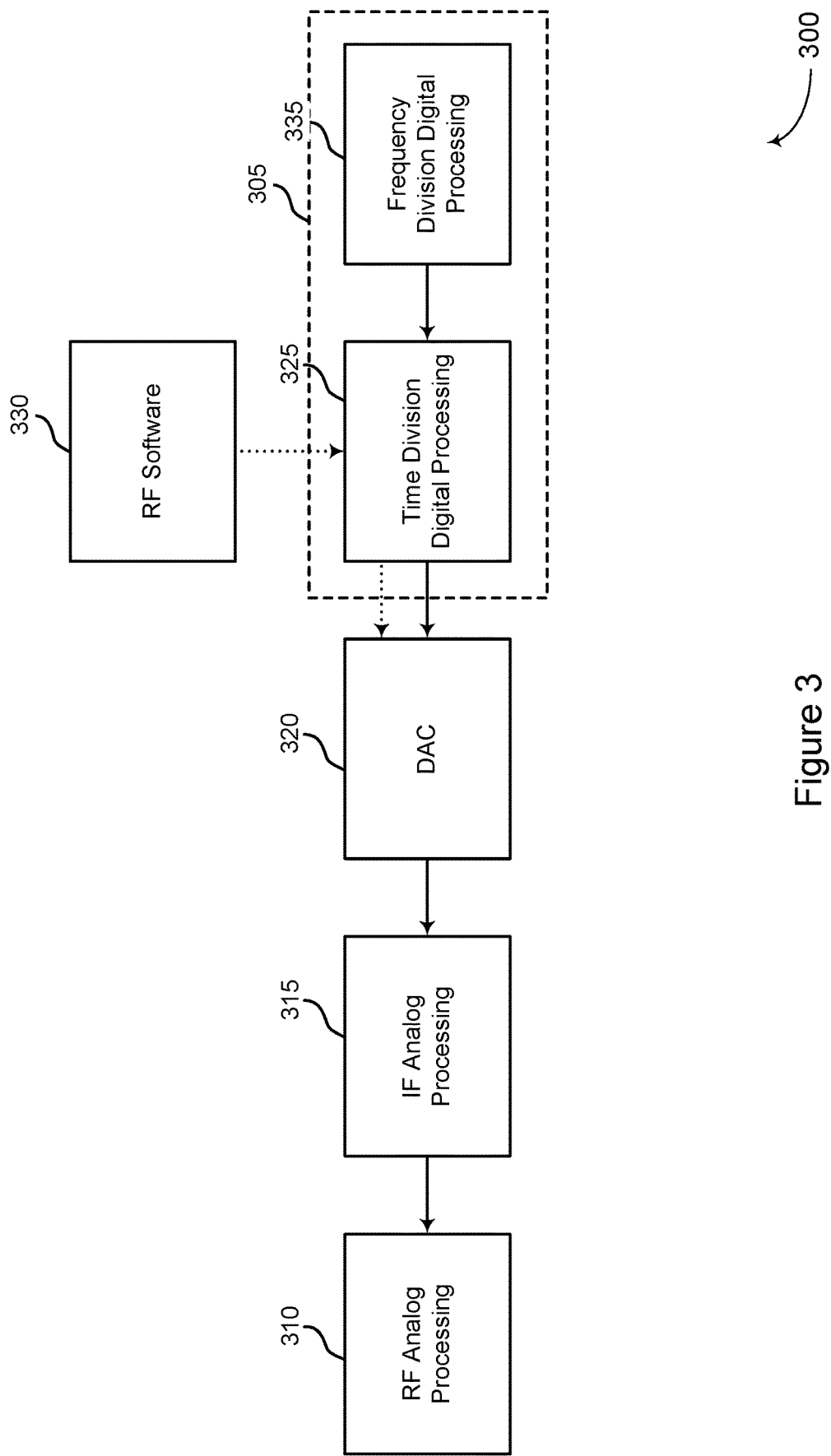
FIG. 3 illustrates an example of an apparatus that supports a dynamic TxFE and a dynamic DAC in a modem in accordance with aspects of the present disclosure.

FIG. 3 illustrates an example of an apparatus 300 that supports a dynamic TxFE 305 and a dynamic DAC 320 in a modem in accordance with aspects of the present disclosure. In some examples, the components in the apparatus 300 may implement aspects of the wireless communications system 100. For example, the apparatus 300 may be an example of a modem 155 as described with reference to FIG. 1. The TxFE 305 may be an example of a TxFE component 160 as described with reference to FIG. 1 and the DAC 320 may be an example of a DAC 165 as described with reference to FIG. 1.

The TxFE 305 may include a time division digital processing component 325 and a frequency division digital processing component 335. The apparatus 300 may use the TxFE 305 to perform digital processing (for example, via time division digital processing component 325) on signals to be transmitted from the apparatus 300. The apparatus 300 may also include an RF software component 330. The RF software component 330 may be operable to provide ENOB or NOB control signaling to the TxFE 305 (for example, via time division digital processing component 325) and the time division digital processing component 325 may be operable to provide ENOB control signaling to the DAC 320. In some cases, the DAC 320 may be a subcomponent of TxFE 305. Additionally or alternatively, the TxFE 305 may exclude the frequency division digital processing component 335.

The frequency division digital processing component 335 may provide signaling to time division digital processing component 325. After performing time division digital processing, the time division digital processing component 325 may provide signaling to the DAC 320, which may convert the signaling from a digital signal to an analog signal. The DAC 320 may provide the analog signal to an IF analog processing component 315, which may perform IF analog processing on the signaling. The IF analog processing component 315 may provide the signaling to an RF analog processing component 310, which may perform RF analog processing on the signaling.

In some examples, the UE 115 may dynamically adjust one or both of an ENOB input to the DAC 320 or an NOB input to the TxFE 305. A determination to perform the dynamic adjusting may be based, as described with reference to FIG. 2, on receiving a downlink control message that indicates one or both of an MCS or a number of layers. Performing the dynamic adjusting may involve activating (for example, enabling) or deactivating (for example, disabling) subcomponents of the TxFE 305. The subcomponents may be configured for receiving the ENOB, the NOB, or both. Additionally or alternatively, performing the dynamic adjusting may involve selecting a greater number or lesser number of lines, pins, or other components over which to transmit the ENOB to the DAC 320, over which to transmit the NOB to the TxFE 305, or both.

Upon performing the dynamic adjusting to reduce the NOB of the TxFE 305, the ENOB of the DAC 320, or both, the TxFE 305, the DAC 320, or both may consume less power. In turn, the apparatus 300 may consume less power. As described herein, consuming less power may enable a power source, such as battery, powering the apparatus 300 to be depleted at a lower rate.

Figure 4:
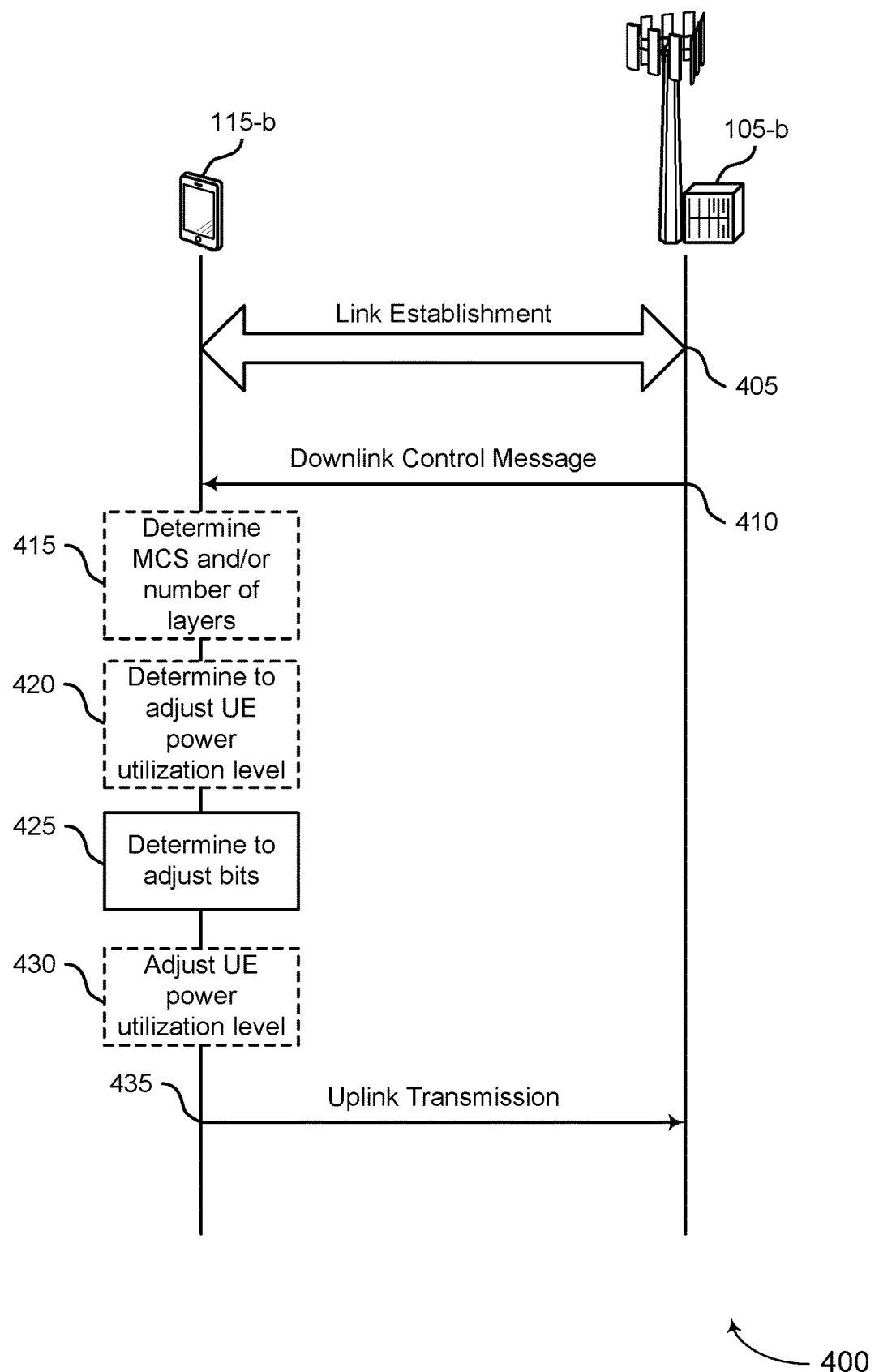
FIG. 4 illustrates an example of a process flow that supports operation of a dynamic TxFE and a dynamic DAC in a modem in accordance with aspects of the present disclosure.

FIG. 4 illustrates an example of a process flow 400 that supports operation of a dynamic TxFE and a dynamic DAC in a modem in accordance with aspects of the present disclosure. In some examples, the process flow 400 may be implemented by aspects of the wireless communications system 100. For example, a base station 105-*b* associated with the process flow 400 may be an example of a base station 105 as described with reference to FIG. 1 and a UE 115-*b* associated with the process flow 400 may be an example of a UE 115 as described with reference to FIG. 1. The process flow 400 may illustrate operations undertaken to adjust (for example, reduce) one or both of the ENOB of a DAC (for example, a DAC 320) or the NOB of a TxFE (for example, a TxFE 305), such as described with reference to FIGS. 2 and 3.

At 405, the base station 105-*b* may establish a communication link with the UE 115-*b*. In some examples, the UE 115-*b* may initiate the establishment of the communication link. In some examples, the base station 105-*b* may initiate the establishment of the communication link.

In some examples, the base station 105-*b* may determine to adjust a power consumption level (or power utilization level) of the UE 115-*b*. In some example, the base station 105-*b* may determine to adjust the power consumption level when determining that an SNR associated with transmissions from the UE 115-*b* is above a threshold amount. Transmissions whose SNRs are above a threshold amount may indicate, to the base station 105-*b*, that the UE 115-*b* is consuming more power than necessary. Additionally or alternatively, the base station 105-*b* may determine to adjust the power consumption level when determining that the UE 115-*b* is to operate in a lower-power mode.

At 410, the base station 105-*b* may transmit, to the UE 115-*b*, a downlink control message including an MCS associated with at least one uplink transmission (the MCS may be determined by the base station 105-*b*), or a number of layers associated with the at least one uplink transmission (for example, a number of layers in the at least one uplink transmission), or both. In some examples, the MCS, the number of layers, or both, may indicate to the UE 115-*b* to adjust (for example, reduce) a first number of bits. For example, if the MCS, the number of layers, or both are below a threshold amount, the UE 115-*b* may adjust the first number of bits. The base station 105-*b* and the UE 115-*b* may support an MCS lower than that supported by other base stations 105 and UEs 115. In some examples, the first number of bits may be associated with the ENOB supported at the DAC of the UE 115-*b*, the NOB supported at the TxFE component of the UE 115-*b*, or both. In some examples, the MCS, the number of layers, or both, may be included in DCI of the downlink control message. In some examples, the MCS, the number of layers, or both, may indicate a second number of bits by which to adjust (for example, reduce) the ENOB supported at a DAC of the UE 115-b or a third number of bits by which to adjust (for example, reduce) the NOB supported at a TxFE component of the UE 115-b, or both.

At 415, the UE 115-b may determine the MCS, or the number of layers, or both from the downlink control message. At 420, the UE 115-b may determine to adjust a power consumption level of the UE 115-b.

At 425, the UE 115-b may determine to adjust (for example, reduce) a first number of bits supported by one or more components of the UE 115-b using the MCS, or the number of layers, or both. For example, different MCS values or number of layers may map to different numbers by which to adjust the first number of bits. The first number of bits may include the ENOB supported at the DAC of the UE 115-b, or the NOB supported at the TxFE component of the UE 115-b, or both. In some examples, the UE 115-b determining to adjust the first number of bits may include the UE 115-b determining to adjust the ENOB supported at the DAC, or determining to adjust the NOB supported at the TxFE component, or both. In some examples, a second number of bits adjusted from the ENOB supported at the DAC may be the same as a third number of bits adjusted from the NOB supported at the TxFE component. In some other examples, the second number of bits adjusted from the ENOB supported at the DAC may be different than the third number of bits adjusted from the NOB supported at the TxFE component.

In some examples, the UE 115-b determining to adjust the first number of bits may involve the UE 115-b determining, according to the MCS, the number of layers, or both, a second number of bits by which to adjust the ENOB supported at the DAC and a third number of bits by which to adjust the NOB supported at the TxFE component. In such cases, the UE 115-b determining the second number of bits, the third number of bits, or both may involve retrieving the second number of bits, the third number of bits, or both from a location, such as within the UE 115-b, (for example, from a look-up table) using the MCS, the number of layers, or both.

In some examples, one or more bits adjusted from the first number of bits may be LSBs of the first number of bits. In some examples, the UE 115-b may determine to adjust the first number of bits when the at least one uplink transmission includes a mmW transmission. Additionally or alternatively, the UE 115-b may determine to adjust the first number of bits when the at least one uplink transmission includes a sub-6 GHz transmission. In some examples, the ENOB may be a number of bits associated with a resolution of a DAC, for example, the ENOB may be less than a maximum number of bits associated with the resolution of the DAC. Reducing the ENOB may limit a resolution of the DAC such that the DAC does not generate signals associated with high SNRs, which may involve the DAC consuming more power than when generating signals associated with low or middle-valued SNRs. In some examples, the UE 115-b may determine to adjust the first number of bits after the UE 115-b determines to adjust the power consumption level at 420. In some examples, the UE 115-b may determine to adjust the first number of bits after determining the MCS, or the number of layers, or both, from the downlink control message.

At 430, the UE 115-b may adjust the power consumption level of the UE 115-b after determining to adjust the power consumption level. In some examples, the UE 115-b may adjust the power consumption level by reducing the ENOB supported at the DAC, or reducing the NOB supported at the TxFE component, or both. Reducing the ENOB, the NOB, or both, may limit the SNR of uplink transmissions, which may limit the amount of power consumed by the DAC, the TxFE component, or both, respectively.

At 435, the UE 115-b may transmit the at least one uplink transmission according to the adjusted first number of bits, the adjusted power consumption level, or both. For example, by reducing the first number of bits, the SNR of the at least one uplink transmission may also be adjusted. The base station 105-b may receive the at least one uplink transmission using one or both of the MCS and the number of layers indicating to adjust the first number of bits. In some examples, the base station 105-b may receive the at least one uplink transmission when the UE 115-b determines to adjust the power consumption level of the UE 115-b. In this way, the UE 115-b may be configured to adjust (for example, reduce) a number of bits enabled by one or more components of the UE 115-b to more efficiently and effectively dynamically adjust power consumption or utilization for one or more uplink transmissions.

Figure 5:
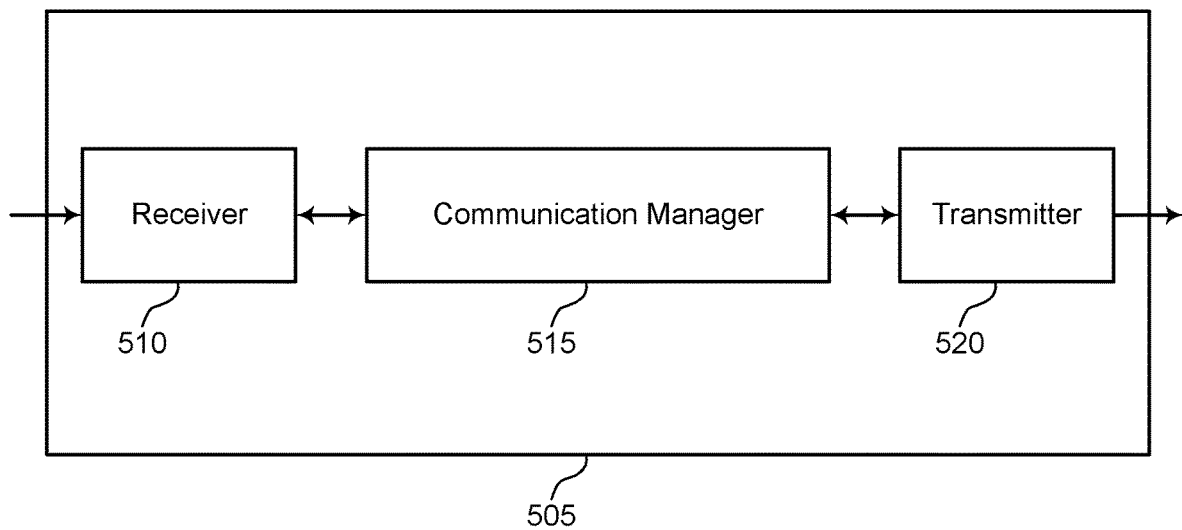
FIGS. 5 and 6 show block diagrams of devices that support a dynamic TxFE and a dynamic DAC in a modem in accordance with aspects of the present disclosure.

FIG. 5 shows a block diagram of a device 505 that supports a dynamic TXFE and a dynamic DAC in a modem in accordance with aspects of the present disclosure. The device 505 may be an example of aspects of a UE 115 as described herein. The device 505 may include a receiver 510, a communication manager 515, and a transmitter 520. The communication manager 515 can be implemented, at least in part, by one or both of a modem and a processor. Each of these components may be in communication with one another (for example, via one or more buses).

The receiver 510 may receive information such as packets, user data, or control information associated with various information channels (for example, control channels, data channels, and information related to a dynamic TXFE and a dynamic DAC in a modem). Information may be passed on to other components of the device 505. The receiver 510 may be an example of aspects of the transceiver 815 described with reference to FIG. 7. The receiver 510 may utilize a single antenna or a set of antennas.

The communication manager 515 may receive a downlink control message including at least one of a modulation and coding scheme associated with at least one uplink transmission or a number of layers associated with the at least one uplink transmission, determine to adjust (for example, reduce) a first number of bits based on the at least one of the modulation and coding scheme or the number of layers. In some examples, the first number of bits includes at least one of an effective number of bits supported at a digital-to-analog converter of the UE or a number of bits supported at a transmission front end component of the UE, and transmit the at least one uplink transmission according to the adjusted first number of bits.

The transmitter 520 may transmit signals generated by other components of the device 505. In some examples, the transmitter 520 may be collocated with a receiver 510 in a transceiver component. For example, the transmitter 520 may be an example of aspects of the transceiver 815 described with reference to FIG. 7. The transmitter 520 may utilize a single antenna or a set of antennas.

Figure 6:
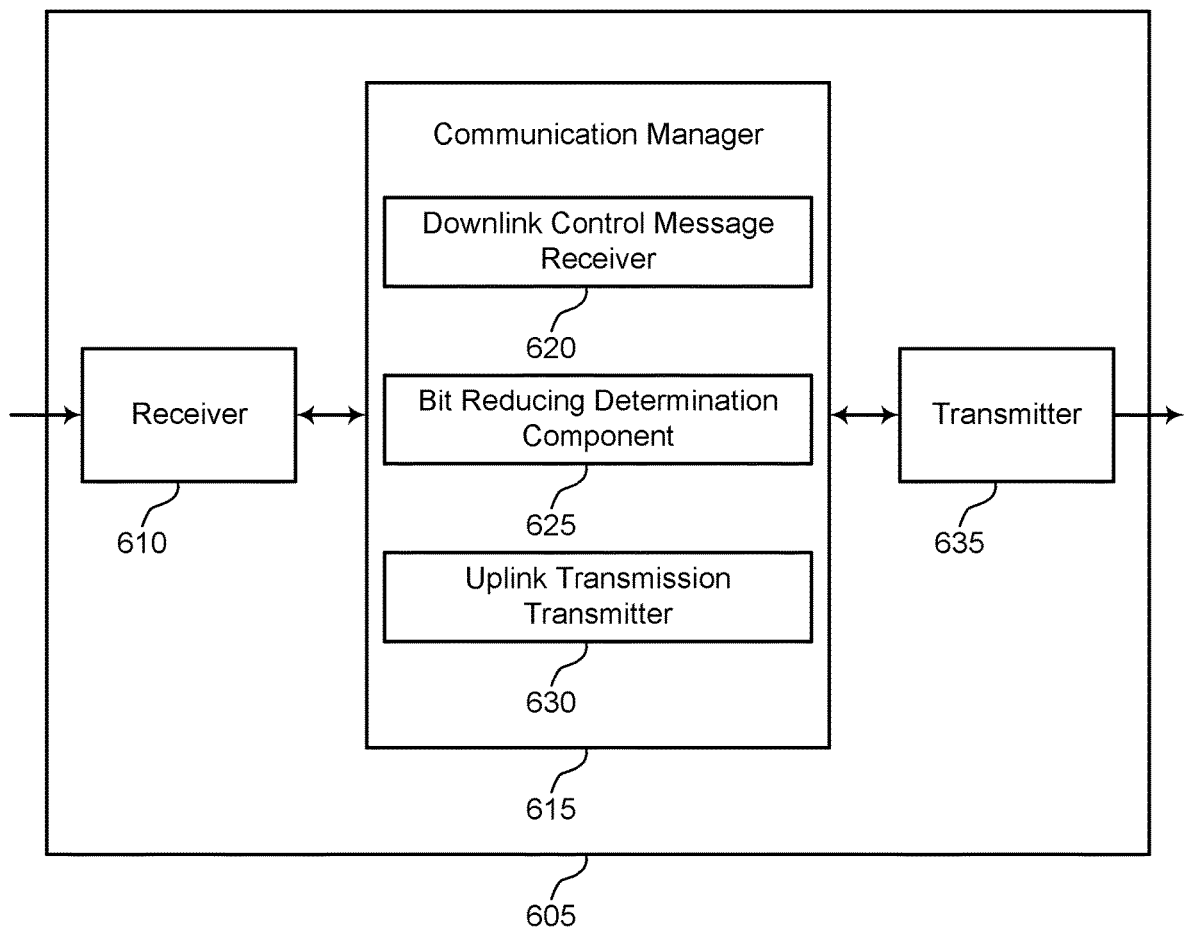

FIG. 6 shows a block diagram of a device 605 that supports a dynamic TXFE and a dynamic DAC in a modem in accordance with aspects of the present disclosure. The device 605 may be an example of aspects of a device 505, or a UE 115 as described herein. The device 605 may include a receiver 610, a communication manager 615, and a transmitter 635. The communication manager 615 can be implemented, at least in part, by one or both of a modem and a processor. Each of these components may be in communication with one another (for example, via one or more buses).

The receiver 610 may receive information such as packets, user data, or control information associated with various information channels (for example, control channels, data channels, and information related to a dynamic TXFE and a dynamic DAC in a modem). Information may be passed on to other components of the device 605. The receiver 610 may be an example of aspects of the transceiver 815 described with reference to FIG. 7. The receiver 610 may utilize a single antenna or a set of antennas.

The communication manager 615 may be an example of aspects of the communication manager 515 as described herein. The communication manager 615 may include a downlink control message receiver 620, a bit reducing determination component 625, and an uplink transmission transmitter 630. The communication manager 615 may be an example of aspects of the communication manager 810 described herein.

The downlink control message receiver 620 may receive a downlink control message including at least one of a modulation and coding scheme associated with at least one uplink transmission or a number of layers associated with the at least one uplink transmission.

The bit reducing determination component 625 may determine to adjust (for example, reduce) a first number of bits based on the at least one of the modulation and coding scheme or the number of layers. In some examples, the first number of bits includes at least one of an effective number of bits supported at a digital-to-analog converter of the UE or a number of bits supported at a transmission front end component of the UE.

The uplink transmission transmitter 630 may transmit the at least one uplink transmission according to the adjusted first number of bits.

The transmitter 635 may transmit signals generated by other components of the device 605. In some examples, the transmitter 635 may be collocated with a receiver 610 in a transceiver component. For example, the transmitter 635 may be an example of aspects of the transceiver 815 described with reference to FIG. 7. The transmitter 635 may utilize a single antenna or a set of antennas.

Figure 7:
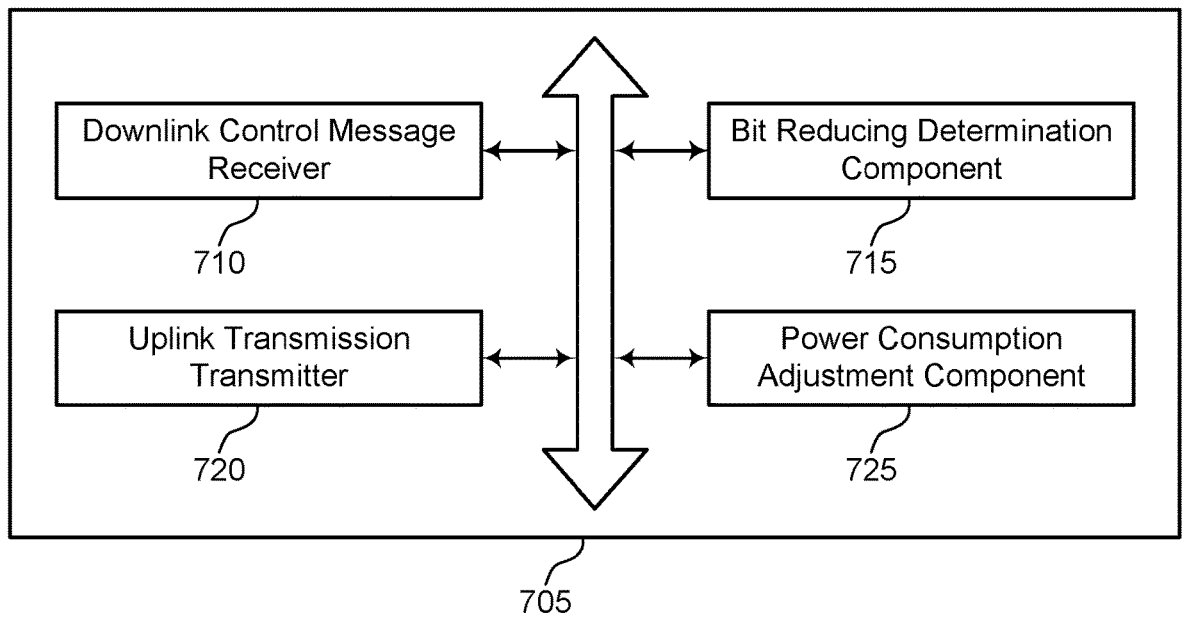
FIG. 7 shows a block diagram of a communication manager that supports a dynamic TxFE and a dynamic DAC in a modem in accordance with aspects of the present disclosure.

FIG. 7 shows a block diagram of a communication manager 705 that supports a dynamic TXFE and a dynamic DAC in a modem in accordance with aspects of the present disclosure. The communication manager 705 may be an example of aspects of a communication manager 515, a communication manager 615, or a communication manager 810 described herein. The communication manager 705 may include a downlink control message receiver 710, a bit reducing determination component 715, an uplink transmission transmitter 720, and a power consumption adjustment component 725. Each of these components may communicate, directly or indirectly, with one another (for example, via one or more buses).

The downlink control message receiver 710 may receive a downlink control message including at least one of a modulation and coding scheme associated with at least one uplink transmission or a number of layers associated with the at least one uplink transmission. In some examples, receiving the downlink control message includes receiving downlink control information indicating the at least one of the modulation and coding scheme or the number of layers.

The bit reducing determination component 715 may determine to adjust (for example, reduce) a first number of bits based on the at least one of the modulation and coding scheme or the number of layers. In some examples, the first number of bits includes at least one of an effective number of bits supported at a digital-to-analog converter of the UE or a number of bits supported at a transmission front end component of the UE. In some examples, the bit reducing determination component 715 may determine to adjust the effective number of bits supported at the digital-to-analog converter. In some examples, the bit reducing determination component 715 may determine to adjust the number of bits supported at the transmission front end component.

In some examples, the bit reducing determination component 715 may determine, based on the at least one of the modulation and coding scheme or the number of layers, a second number of bits by which to adjust (for example, reduce) the effective number of bits supported at the digital-to-analog converter and a third number of bits by which to adjust (for example, reduce) the number of bits supported at the transmission front end component. In some examples, the bit reducing determination component 715 may retrieve the second number of bits and the third number of bits based on the one or more of the modulation and coding scheme or the number of layers. In some examples, the bit reducing determination component 715 may determine the at least one of the modulation and coding scheme or the number of layers based on the downlink control message. In some examples, determining to adjust the first number of bits is based on the determining. In some examples, a second number of bits adjusted (for example, reduced) from the effective number of bits supported at the digital-to-analog converter is the same as a third number of bits adjusted (for example, reduced) from the number of bits supported at the transmission front end component.

In some examples, one or more bits adjusted from the first number of bits are least significant bits of the first number of bits. In some examples, determining to adjust the first number of bits is based on the at least one uplink transmission comprising a millimeter-wave transmission. In some examples, determining to adjust the first number of bits is based on the at least one uplink transmission comprising a sub-6 gigahertz transmission In some examples, the effective number of bits includes a number of bits associated with a resolution of the digital-to-analog converter. In some examples, the effective number of bits is less than the number of bits associated with the resolution of the digital-to-analog converter.

The uplink transmission transmitter 720 may transmit the at least one uplink transmission according to the adjusted first number of bits.

The power consumption adjustment component 725 may determine to adjust a power consumption level of the UE. In some examples, determining to adjust the first number of bits is based on determining to adjust the power consumption level. In some examples, the power consumption adjustment component 725 may adjust the power consumption level of the UE based on determining to adjust the power consumption level. In some examples, transmitting the at least one uplink transmission is based on adjusting the power consumption level. In some examples, the power consumption adjustment component 725 may adjust a power consumption level of the UE based on reducing the effective number of bits supported at the digital-to-analog converter, or reducing the number of bits supported at the transmission front end component, or both. In some examples, transmitting the at least one uplink transmission is based on adjusting the power consumption level.

Figure 8:
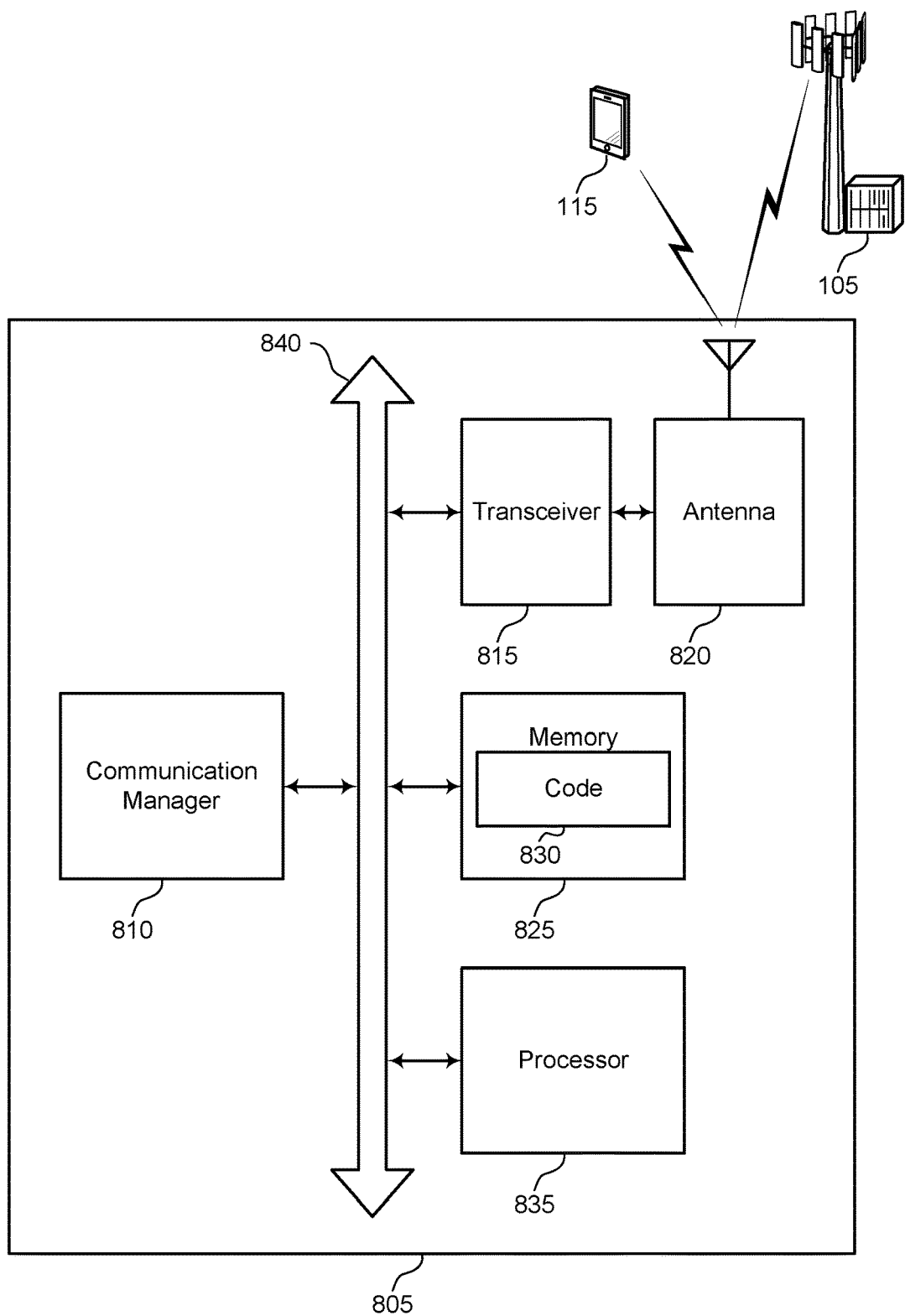
FIG. 8 shows a diagram of a system including a device that supports a dynamic TxFE and a dynamic DAC in a modem in accordance with aspects of the present disclosure.

FIG. 8 shows a diagram of a system including a device 805 that supports a dynamic TXFE and a dynamic DAC in a modem in accordance with aspects of the present disclosure. The device 805 may be an example of or include the components of device 505, device 605, or a UE 115 as described herein. The device 805 may include components for bi-directional voice and data communications including components for transmitting and receiving communications, including a communication manager 810, a transceiver 815, an antenna 820, memory 825, and a processor 835. These components may be in electronic communication via one or more buses (for example, bus 840).

The communication manager 810 may receive a downlink control message including at least one of a modulation and coding scheme associated with at least one uplink transmission or a number of layers associated with the at least one uplink transmission, determine to adjust (for example, reduce) a first number of bits based on the at least one of the modulation and coding scheme or the number of layers. In some examples, the first number of bits includes at least one of an effective number of bits supported at a digital-to-analog converter of the UE or a number of bits supported at a transmission front end component of the UE, and transmit the at least one uplink transmission according to the adjusted first number of bits.

The transceiver 815 may communicate bi-directionally, via one or more antennas, wired, or wireless links as described above. For example, the transceiver 815 may represent a wireless transceiver and may communicate bi-directionally with another wireless transceiver. The transceiver 815 may also include a modem to modulate the packets and provide the modulated packets to the antennas for transmission, and to demodulate packets received from the antennas.

In some examples, the wireless device may include a single antenna 820. However, in some examples the device may have more than one antenna 820, which may be capable of concurrently transmitting or receiving multiple wireless transmissions.

The memory 825 may include random-access memory (RAM) and read-only memory (ROM). The memory 825 may store computer-readable, computer-executable code 830 including instructions that, when executed, cause the processor to perform various functions described herein. In some examples, the memory 825 may contain, among other things, a basic input/output system (BIOS) which may control basic hardware or software operation such as the interaction with peripheral components or devices.

The code 830 may include instructions to implement aspects of the present disclosure, including instructions to support wireless communications. The code 830 may be stored in a non-transitory computer-readable medium such as system memory or other type of memory. In some examples, the code 830 may not be directly executable by the processor 835 but may cause a computer (for example, when compiled and executed) to perform functions described herein.

The processor 835 may include an intelligent hardware device, (for example, a general-purpose processor, a digital signal processor (DSP), a CPU, a microcontroller, an ASIC, a field-programmable gate array (FPGA), a programmable logic device, a discrete gate or transistor logic component, a discrete hardware component, or any combination thereof). In some examples, the processor 835 may be configured to operate a memory array using a memory controller. In other cases, a memory controller may be integrated into the processor 835. The processor 835 may be configured to execute computer-readable instructions stored in a memory (for example, the memory 825) to cause the device 805 to perform various functions (for example, functions or tasks supporting a dynamic TXFE and a dynamic DAC in a modem).

Figure 9:
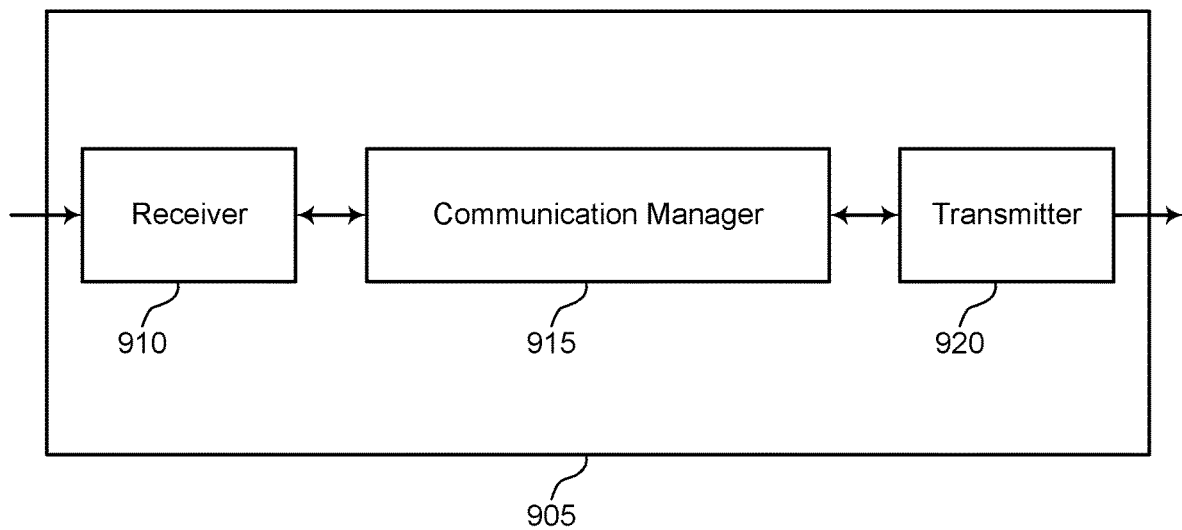
FIGS. 9 and 10 show block diagrams of devices that support a dynamic TxFE and a dynamic DAC in a modem in accordance with aspects of the present disclosure.

FIG. 9 shows a block diagram of a device 905 that supports a dynamic TXFE and a dynamic DAC in a modem in accordance with aspects of the present disclosure. The device 905 may be an example of aspects of a base station 105 as described herein. The device 905 may include a receiver 910, a communication manager 915, and a transmitter 920. The communication manager 915 can be implemented, at least in part, by one or both of a modem and a processor. Each of these components may be in communication with one another (for example, via one or more buses).

The receiver 910 may receive information such as packets, user data, or control information associated with various information channels (for example, control channels, data channels, and information related to a dynamic TXFE and a dynamic DAC in a modem). Information may be passed on to other components of the device 905. The receiver 910 may be an example of aspects of the transceiver 1220 described with reference to FIG. 11. The receiver 910 may utilize a single antenna or a set of antennas.

The communication manager 915 may establish a communication link with a UE, transmit, to the UE, a downlink control message including at least one of a modulation and coding scheme associated with at least one uplink transmission or a number of layers associated with the at least one uplink transmission. In some examples, the at least one of the modulation and coding scheme and the number of layers indicate to adjust (for example, reduce) a first number of bits. In some examples, the first number of bits include at least one of an effective number of bits supported at a digital-to-analog converter of the UE or a number of bits supported at a transmission front end component of the UE, and receive, from the UE, the at least one uplink transmission based on the at least one of the modulation and coding scheme or the number of layers indicating to adjust the first number of bits.

The transmitter 920 may transmit signals generated by other components of the device 905. In some examples, the transmitter 920 may be collocated with a receiver 910 in a transceiver component. For example, the transmitter 920 may be an example of aspects of the transceiver 1220 described with reference to FIG. 11. The transmitter 920 may utilize a single antenna or a set of antennas.

Figure 10:
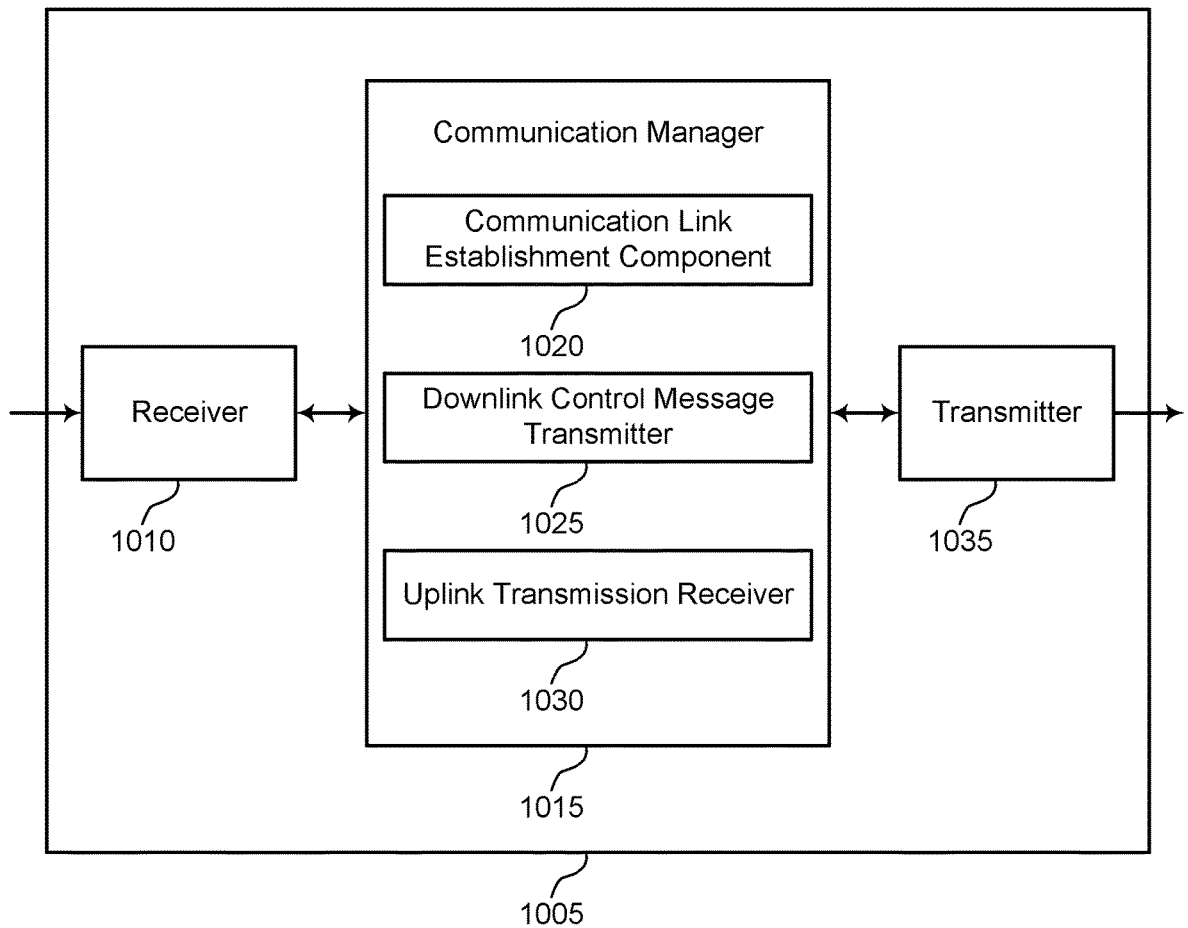

FIG. 10 shows a block diagram of a device 1005 that supports a dynamic TXFE and a dynamic DAC in a modem in accordance with aspects of the present disclosure. The device 1005 may be an example of aspects of a device 905, or a base station 105 as described herein. The device 1005 may include a receiver 1010, a communication manager 1015, and a transmitter 1035. The communication manager 1015 can be implemented, at least in part, by one or both of a modem and a processor. Each of these components may be in communication with one another (for example, via one or more buses).

The receiver 1010 may receive information such as packets, user data, or control information associated with various information channels (for example, control channels, data channels, and information related to a dynamic TXFE and a dynamic DAC in a modem). Information may be passed on to other components of the device 1005. The receiver 1010 may be an example of aspects of the transceiver 1220 described with reference to FIG. 11. The receiver 1010 may utilize a single antenna or a set of antennas.

The communication manager 1015 may be an example of aspects of the communication manager 915 as described herein. The communication manager 1015 may include a communication link establishment component 1020, a downlink control message transmitter 1025, and an uplink transmission receiver 1030. The communication manager 1015 may be an example of aspects of the communication manager 1210 described herein.

The communication link establishment component 1020 may establish a communication link with a UE.

The downlink control message transmitter 1025 may transmit, to the UE, a downlink control message including at least one of a modulation and coding scheme associated with at least one uplink transmission or a number of layers associated with the at least one uplink transmission. In some examples, the at least one of the modulation and coding scheme and the number of layers indicate to adjust (for example, reduce) a first number of bits. In some examples, the first number of bits include at least one of an effective number of bits supported at a digital-to-analog converter of the UE or a number of bits supported at a transmission front end component of the UE.

The uplink transmission receiver 1030 may receive, from the UE, the at least one uplink transmission based on the at least one of the modulation and coding scheme or the number of layers indicating to adjust the first number of bits.

The transmitter 1035 may transmit signals generated by other components of the device 1005. In some examples, the transmitter 1035 may be collocated with a receiver 1010 in a transceiver component. For example, the transmitter 1035 may be an example of aspects of the transceiver 1220 described with reference to FIG. 11. The transmitter 1035 may utilize a single antenna or a set of antennas.

Figure 11:
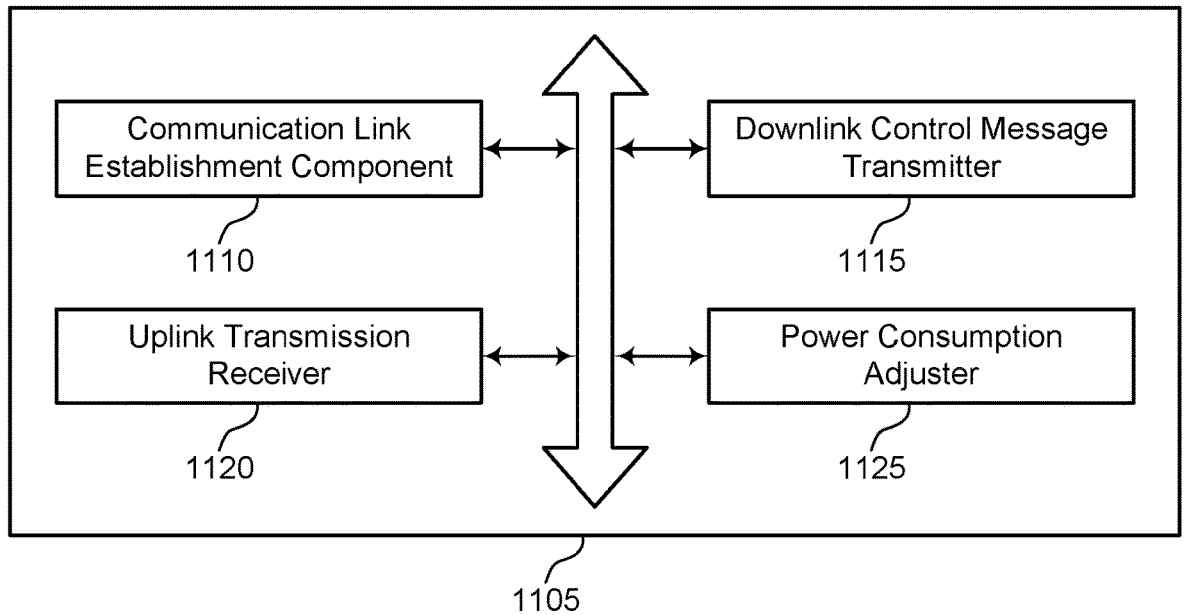
FIG. 11 shows a block diagram of a communication manager that supports a dynamic TxFE and a dynamic DAC in a modem in accordance with aspects of the present disclosure.

FIG. 11 shows a block diagram of a communication manager 1105 that supports a dynamic TXFE and a dynamic DAC in a modem in accordance with aspects of the present disclosure. The communication manager 1105 may be an example of aspects of a communication manager 915, a communication manager 1015, or a communication manager 1210 described herein. The communication manager 1105 may include a communication link establishment component 1110, a downlink control message transmitter 1115, an uplink transmission receiver 1120, and a power consumption adjuster 1125. Each of these components may communicate, directly or indirectly, with one another (for example, via one or more buses).

The communication link establishment component 1110 may establish a communication link with a UE.

The downlink control message transmitter 1115 may transmit, to the UE, a downlink control message including at least one of a modulation and coding scheme associated with at least one uplink transmission or a number of layers associated with the at least one uplink transmission. In some examples, the at least one of the modulation and coding scheme and the number of layers indicate to adjust (for example) a first number of bits. In some examples, the first number of bits include at least one of an effective number of bits supported at a digital-to-analog converter of the UE or a number of bits supported at a transmission front end component of the UE. In some examples, the effective number of bits includes a number of bits associated with a resolution of the digital-to-analog converter. In some examples, the effective number of bits is less than the number of bits associated with the resolution of the digital-to-analog converter.

The uplink transmission receiver 1120 may receive, from the UE, the at least one uplink transmission based on the at least one of the modulation and coding scheme or the number of layers indicating to adjust the first number of bits.

The power consumption adjuster 1125 may determine that a signal to noise ratio (SNR) associated with a transmission of the UE is above a threshold amount. In some cases, transmitting the downlink control message may be based on the determining.

Figure 12:
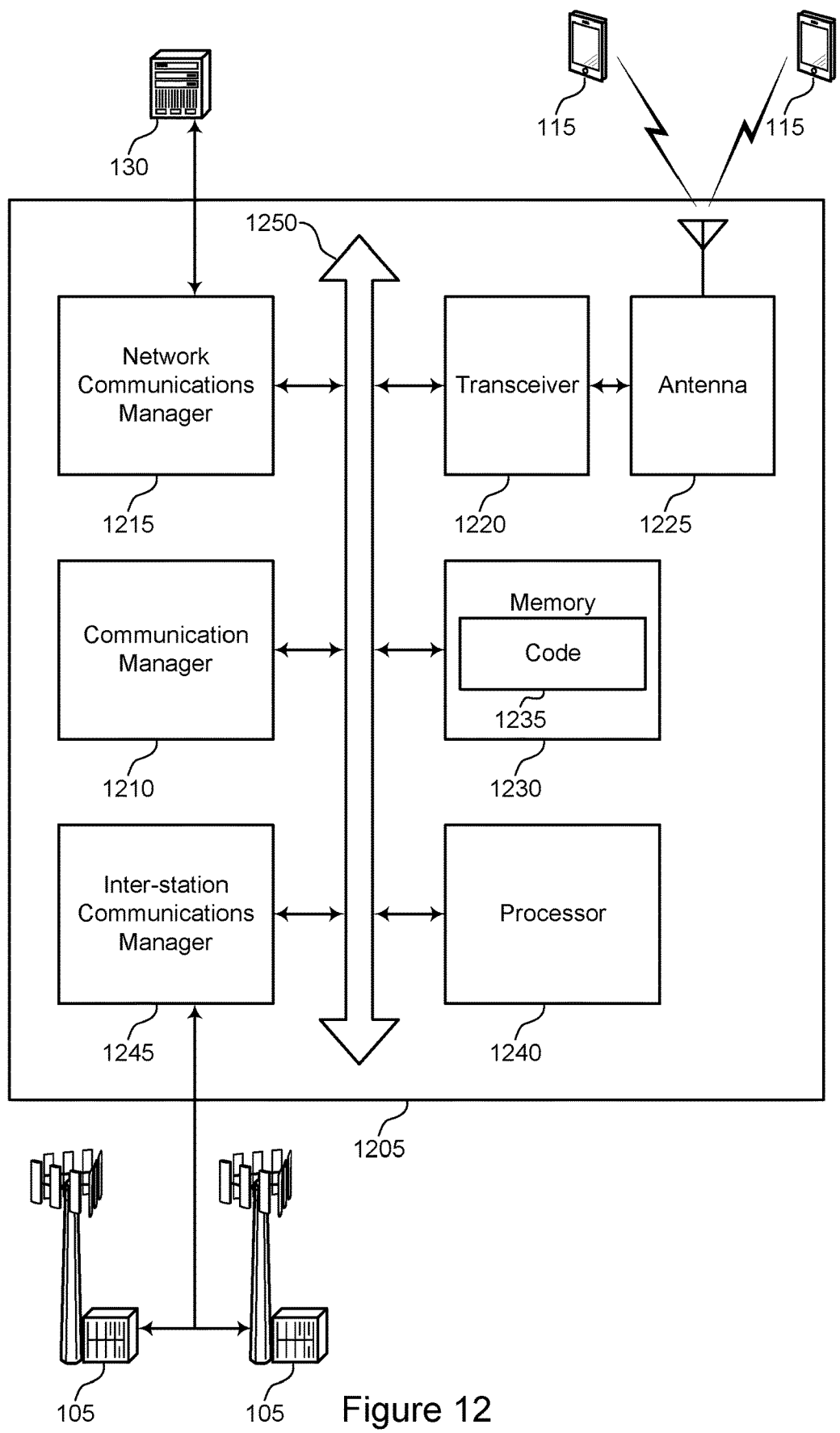
FIG. 12 shows a diagram of a system including a device that supports a dynamic TxFE and a dynamic DAC in a modem in accordance with aspects of the present disclosure.

FIG. 12 shows a diagram of a system including a device 1205 that supports a dynamic TXFE and a dynamic DAC in a modem in accordance with aspects of the present disclosure. The device 1205 may be an example of or include the components of device 905, device 1005, or a base station 105 as described herein. The device 1205 may include components for bi-directional voice and data communications including components for transmitting and receiving communications, including a communication manager 1210, a network communications manager 1215, a transceiver 1220, an antenna 1225, memory 1230, a processor 1240, and an inter-station communications manager 1245. These components may be in electronic communication via one or more buses (for example, bus 1250).

The communication manager 1210 may establish a communication link with a UE, transmit, to the UE, a downlink control message including at least one of a modulation and coding scheme associated with at least one uplink transmission or a number of layers associated with the at least one uplink transmission. In some examples, the at least one of the modulation and coding scheme and the number of layers indicate to adjust (for example, reduce) a first number of bits. In some examples, the first number of bits include at least one of an effective number of bits supported at a digital-to-analog converter of the UE or a number of bits supported at a transmission front end component of the UE, and receive, from the UE, the at least one uplink transmission based on the at least one of the modulation and coding scheme or the number of layers indicating to adjust the first number of bits.

The network communications manager 1215 may manage communications with the core network (for example, via one or more wired backhaul links). For example, the network communications manager 1215 may manage the transfer of data communications for client devices, such as one or more UEs 115.

The transceiver 1220 may communicate bi-directionally, via one or more antennas, wired, or wireless links as described above. For example, the transceiver 1220 may represent a wireless transceiver and may communicate bi-directionally with another wireless transceiver. The transceiver 1220 may also include a modem to modulate the packets and provide the modulated packets to the antennas for transmission, and to demodulate packets received from the antennas.

In some examples, the wireless device may include a single antenna 1225. However, in some examples the device may have more than one antenna 1225, which may be capable of concurrently transmitting or receiving multiple wireless transmissions.

The memory 1230 may include RAM and ROM. The memory 1230 may store computer-readable, computer-executable code 1235 including instructions that, when executed, cause the processor to perform various functions described herein. In some examples, the memory 1230 may contain, among other things, a BIOS which may control basic hardware or software operation such as the interaction with peripheral components or devices.

The code 1235 may include instructions to implement aspects of the present disclosure, including instructions to support wireless communications. The code 1235 may be stored in a non-transitory computer-readable medium such as system memory or other type of memory. In some examples, the code 1235 may not be directly executable by the processor 1240 but may cause a computer (for example, when compiled and executed) to perform functions described herein.

The processor 1240 may include an intelligent hardware device, (for example, a general-purpose processor, a DSP, a CPU, a microcontroller, an ASIC, an FPGA, a programmable logic device, a discrete gate or transistor logic component, a discrete hardware component, or any combination thereof). In some examples, the processor 1240 may be configured to operate a memory array using a memory controller. In other cases, a memory controller may be integrated into the processor 1240. The processor 1240 may be configured to execute computer-readable instructions stored in a memory (for example, the memory 1230) to cause the device 1205 to perform various functions (for example, functions or tasks supporting a dynamic TXFE and a dynamic DAC in a modem).

The inter-station communications manager 1245 may manage communications with other base station 105, and may include a controller or scheduler for controlling communications with UEs 115 in cooperation with other base stations 105. For example, the inter-station communications manager 1245 may coordinate scheduling for transmissions to UEs 115 for various interference mitigation techniques such as beamforming or joint transmission. In some examples, the inter-station communications manager 1245 may provide an X2 interface within an LTE/LTE-A wireless communication network technology to provide communication between base stations 105.

Figure 13:
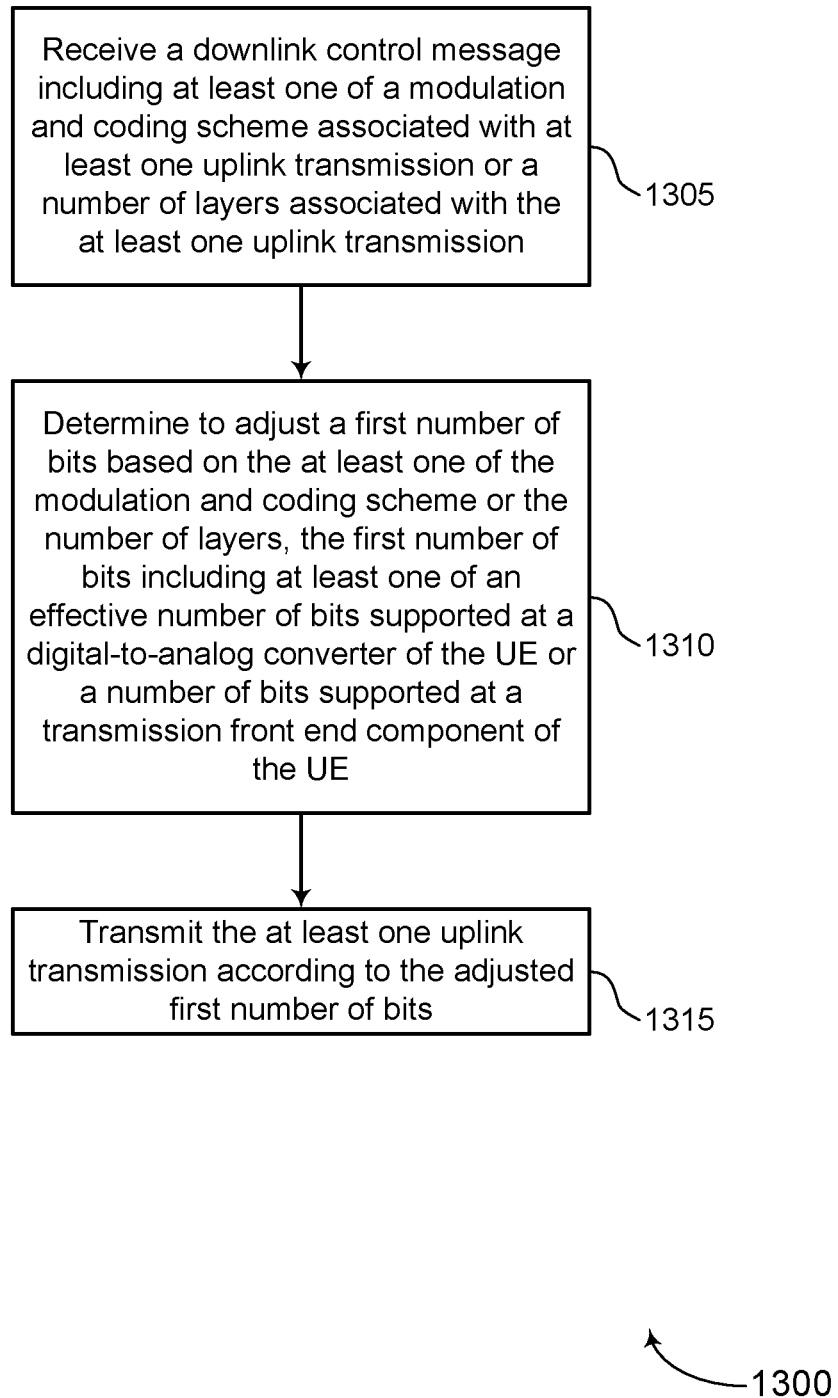
FIGS. 13 through 17 show flowcharts illustrating methods that support a dynamic TxFE and a dynamic DAC in a modem in accordance with aspects of the present disclosure.

FIG. 13 shows a flowchart illustrating a method 1300 that supports a dynamic TXFE and a dynamic DAC in a modem in accordance with aspects of the present disclosure. The operations of method 1300 may be implemented by a UE 115 or one or more of its components as described herein. For example, the operations of method 1300 may be performed by a communication manager as described with reference to FIGS. 5-8. In some examples, a UE may execute a set of instructions to control the functional elements of the UE to perform the described functions. Additionally or alternatively, a UE may perform aspects of the described functions using special-purpose hardware.

At 1305, the UE may receive a downlink control message including at least one of a modulation and coding scheme associated with at least one uplink transmission or a number of layers associated with the at least one uplink transmission. The operations of 1305 may be performed according to the methods described herein. In some examples, aspects of the operations of 1305 may be performed by a downlink control message receiver as described with reference to FIGS. 5-8.

At 1310, the UE may determine to adjust (for example, reduce) a first number of bits based on the at least one of the modulation and coding scheme or the number of layers, the first number of bits including at least one of an effective number of bits supported at a digital-to-analog converter of the UE or a number of bits supported at a transmission front end component of the UE. The operations of 1310 may be performed according to the methods described herein. In some examples, aspects of the operations of 1310 may be performed by a bit reducing determination component as described with reference to FIGS. 5-8.

At 1315, the UE may transmit the at least one uplink transmission according to the adjusted first number of bits. The operations of 1315 may be performed according to the methods described herein. In some examples, aspects of the operations of 1315 may be performed by an uplink transmission transmitter as described with reference to FIGS. 5-8.

Figure 14:
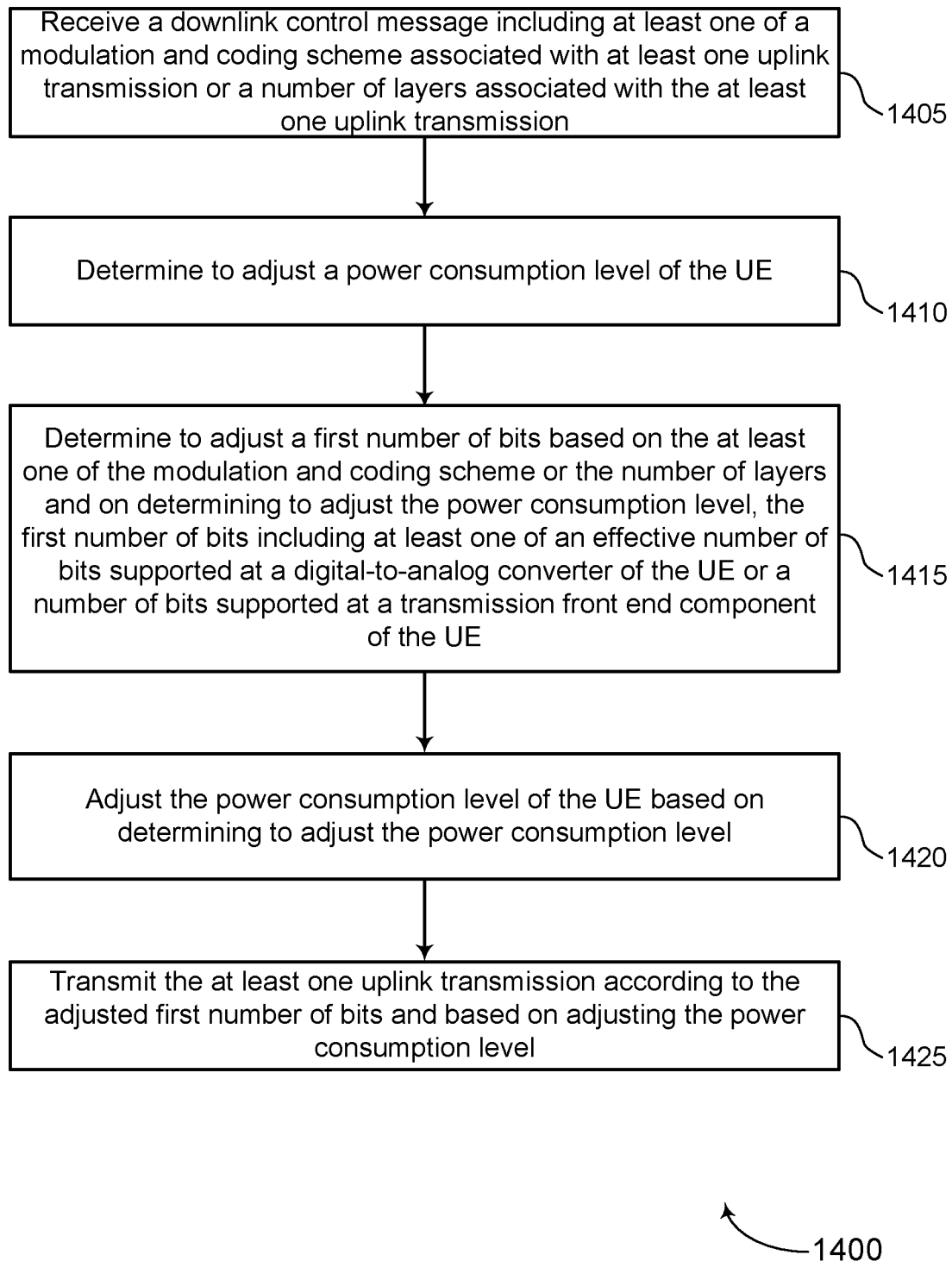

FIG. 14 shows a flowchart illustrating a method 1400 that supports a dynamic transmission front end and a dynamic DAC in a modem in accordance with aspects of the present disclosure. The operations of method 1400 may be implemented by a UE 115 or its components as described herein. For example, the operations of method 1400 may be performed by a communication manager as described with reference to FIGS. 5-8. In some examples, a UE may execute a set of instructions to control the functional elements of the UE to perform the described functions. Additionally or alternatively, a UE may perform aspects of the described functions using special-purpose hardware.

At 1405, the UE may receive a downlink control message including at least one of a modulation and coding scheme associated with at least one uplink transmission or a number of layers associated with the at least one uplink transmission. The operations of 1405 may be performed according to the methods described herein. In some examples, aspects of the operations of 1405 may be performed by a downlink control message receiver as described with reference to FIGS. 5-8.

At 1410, the UE may determine to adjust a power consumption level of the UE. The operations of 1410 may be performed according to the methods described herein. In some examples, aspects of the operations of 1410 may be performed by a power consumption adjustment component as described with reference to FIGS. 5-8.

At 1415, the UE may determine to adjust (for example, reduce) a first number of bits based on the at least one of the modulation and coding scheme or the number of layers and on determining to adjust the power consumption level, the first number of bits including at least one of an effective number of bits supported at a digital-to-analog converter of the UE or a number of bits supported at a transmission front end component of the UE. The operations of 1415 may be performed according to the methods described herein. In some examples, aspects of the operations of 1415 may be performed by a bit reducing determination component as described with reference to FIGS. 5-8.

At 1420, the UE may adjust the power consumption level of the UE based on determining to adjust the power consumption level. The operations of 1420 may be performed according to the methods described herein. In some examples, aspects of the operations of 1420 may be performed by a power consumption adjustment component as described with reference to FIGS. 5-8.

At 1425, the UE may transmit the at least one uplink transmission according to the adjusted first number of bits and based on adjusting the power consumption level. The operations of 1425 may be performed according to the methods described herein. In some examples, aspects of the operations of 1425 may be performed by an uplink transmission transmitter as described with reference to FIGS. 5-8.

Figure 15:
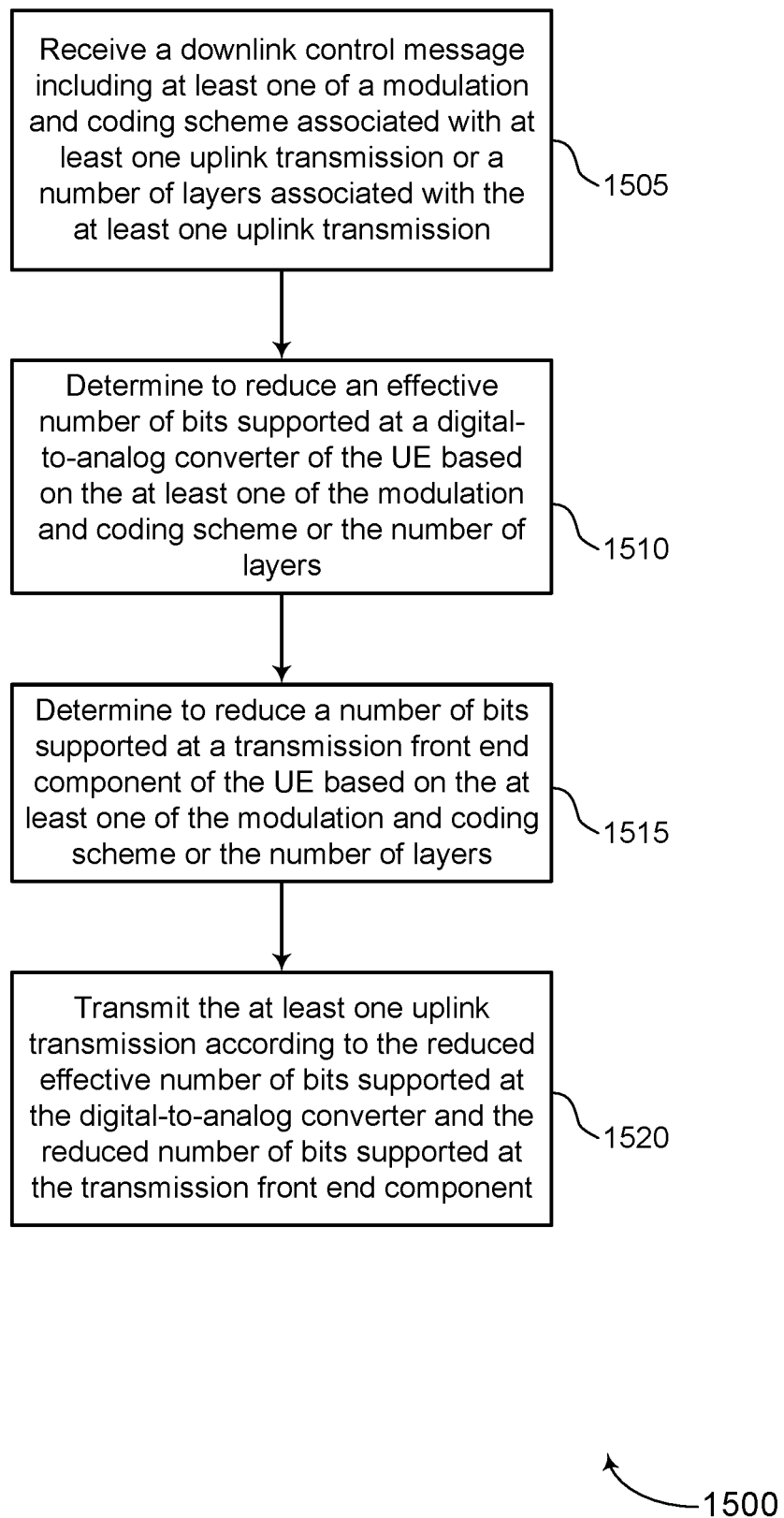

FIG. 15 shows a flowchart illustrating a method 1500 that supports a dynamic TXFE and a dynamic DAC in a modem in accordance with aspects of the present disclosure. The operations of method 1500 may be implemented by a UE 115 or its components as described herein. For example, the operations of method 1500 may be performed by a communication manager as described with reference to FIGS. 5-8. In some examples, a UE may execute a set of instructions to control the functional elements of the UE to perform the described functions. Additionally or alternatively, a UE may perform aspects of the described functions using special-purpose hardware.

At 1505, the UE may receive a downlink control message including at least one of a modulation and coding scheme associated with at least one uplink transmission or a number of layers associated with the at least one uplink transmission. The operations of 1505 may be performed according to the methods described herein. In some examples, aspects of the operations of 1505 may be performed by a downlink control message receiver as described with reference to FIGS. 5-8.

At 1510, the UE may determine to adjust (for example, reduce) an effective number of bits supported at a digital-to-analog converter of the UE based on the at least one of the modulation and coding scheme or the number of layers The operations of 1510 may be performed according to the methods described herein. In some examples, aspects of the operations of 1510 may be performed by a bit reducing determination component as described with reference to FIGS. 5-8.

At 1515, the UE may determine to adjust (for example, reduce) a number of bits supported at a transmission front end component of the UE based on the at least one of the modulation and coding scheme or the number of layers. The operations of 1515 may be performed according to the methods described herein. In some examples, aspects of the operations of 1515 may be performed by a bit reducing determination component as described with reference to FIGS. 5-8.

At 1520, the UE may transmit the at least one uplink transmission according to the adjusted effective number of bits supported at the digital-to-analog converter and the adjusted number of bits supported at the transmission front end component. The operations of 1520 may be performed according to the methods described herein. In some examples, aspects of the operations of 1520 may be performed by an uplink transmission transmitter as described with reference to FIGS. 5-8.

Figure 16:
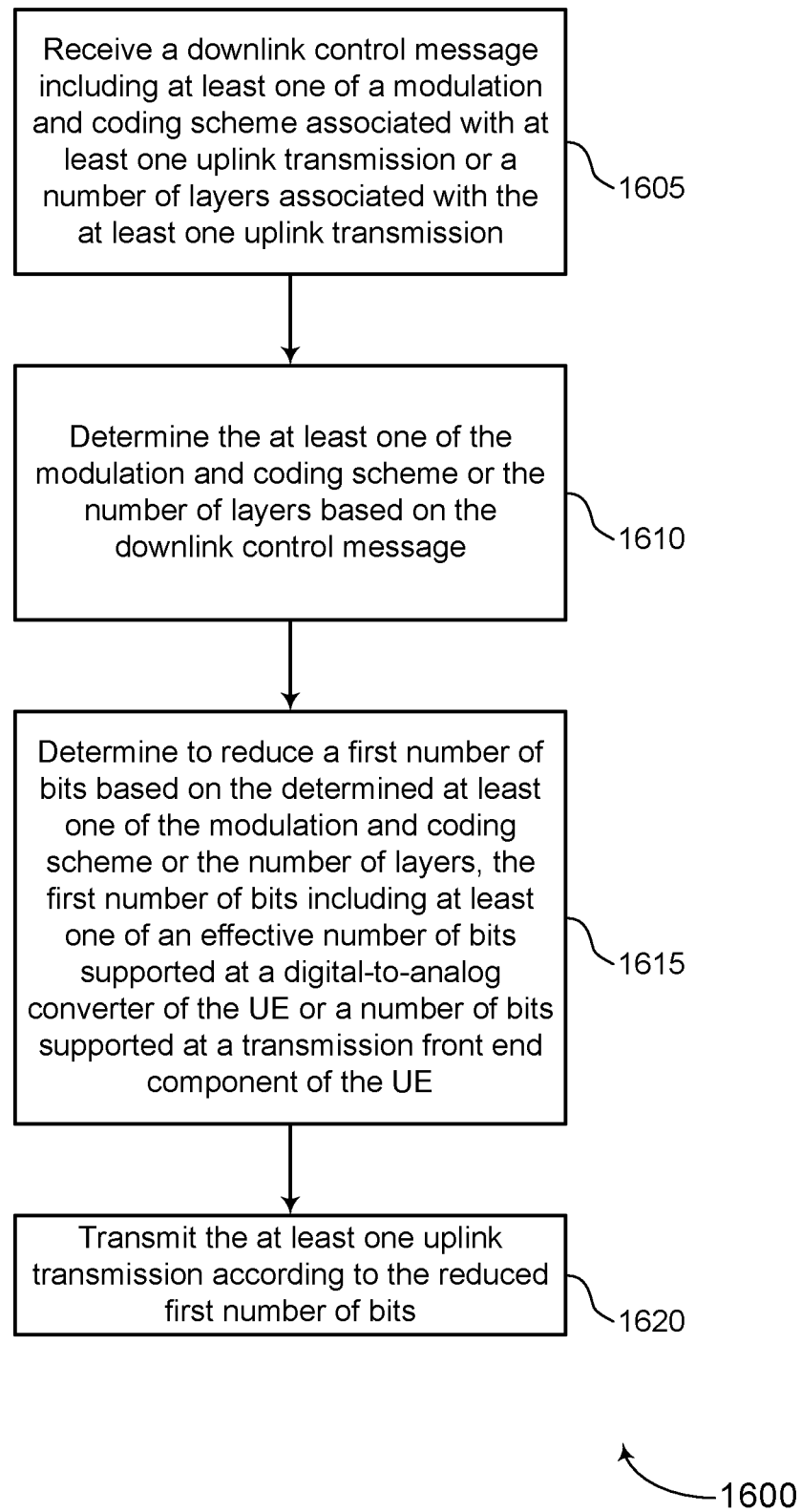

FIG. 16 shows a flowchart illustrating a method 1600 that supports a dynamic TXFE and a dynamic DAC in a modem in accordance with aspects of the present disclosure. The operations of method 1600 may be implemented by a UE 115 or its components as described herein. For example, the operations of method 1600 may be performed by a communication manager as described with reference to FIGS. 5-8. In some examples, a UE may execute a set of instructions to control the functional elements of the UE to perform the described functions. Additionally or alternatively, a UE may perform aspects of the described functions using special-purpose hardware.

At 1605, the UE may receive a downlink control message including at least one of a modulation and coding scheme associated with at least one uplink transmission or a number of layers associated with the at least one uplink transmission. The operations of 1605 may be performed according to the methods described herein. In some examples, aspects of the operations of 1605 may be performed by a downlink control message receiver as described with reference to FIGS. 5-8.

At 1610, the UE may determine the at least one of the modulation and coding scheme or the number of layers based on the downlink control message. The operations of 1610 may be performed according to the methods described herein. In some examples, aspects of the operations of 1610 may be performed by a bit reducing determination component as described with reference to FIGS. 5-8.

At 1615, the UE may determine to adjust (for example, reduce) a first number of bits based on the determined at least one of the modulation and coding scheme or the number of layers, the first number of bits including at least one of an effective number of bits supported at a digital-to-analog converter of the UE or a number of bits supported at a transmission front end component of the UE. The operations of 1615 may be performed according to the methods described herein. In some examples, aspects of the operations of 1615 may be performed by a bit reducing determination component as described with reference to FIGS. 5-8.

At 1620, the UE may transmit the at least one uplink transmission according to the adjusted first number of bits. The operations of 1620 may be performed according to the methods described herein. In some examples, aspects of the operations of 1620 may be performed by an uplink transmission transmitter as described with reference to FIGS. 5-8.

Figure 17:
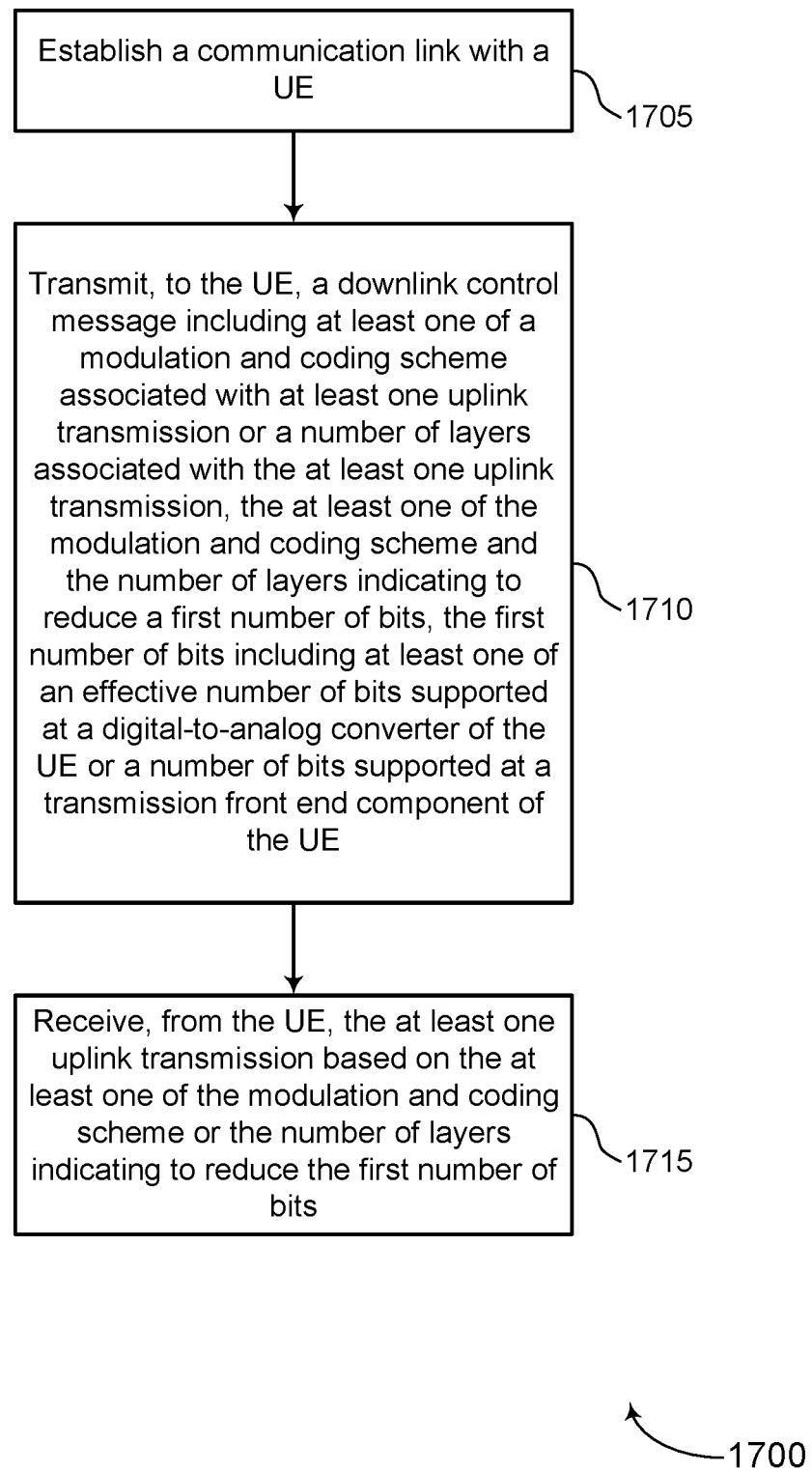

FIG. 17 shows a flowchart illustrating a method 1700 that supports a dynamic TXFE and a dynamic DAC in a modem in accordance with aspects of the present disclosure. The operations of method 1700 may be implemented by a base station 105 or its components as described herein. For example, the operations of method 1700 may be performed by a communication manager as described with reference to FIGS. 9-12. In some examples, a base station may execute a set of instructions to control the functional elements of the base station to perform the described functions. Additionally or alternatively, a base station may perform aspects of the described functions using special-purpose hardware.

At 1705, the base station may establish a communication link with a UE. The operations of 1705 may be performed according to the methods described herein. In some examples, aspects of the operations of 1705 may be performed by a communication link establishment component as described with reference to FIGS. 9-12.

At 1710, the base station may transmit, to the UE, a downlink control message including at least one of a modulation and coding scheme associated with at least one uplink transmission or a number of layers associated with the at least one uplink transmission, the at least one of the modulation and coding scheme and the number of layers indicating to adjust (for example, reduce) a first number of bits, the first number of bits including at least one of an effective number of bits supported at a digital-to-analog converter of the UE or a number of bits supported at a transmission front end component of the UE. The operations of 1710 may be performed according to the methods described herein. In some examples, aspects of the operations of 1710 may be performed by a downlink control message transmitter as described with reference to FIGS. 9-12.

At 1715, the base station may receive, from the UE, the at least one uplink transmission based on the at least one of the modulation and coding scheme or the number of layers indicating to adjust the first number of bits. The operations of 1715 may be performed according to the methods described herein. In some examples, aspects of the operations of 1715 may be performed by an uplink transmission receiver as described with reference to FIGS. 9-12.

The methods described herein describe possible implementations, and the operations and the features may be rearranged or otherwise modified and that other implementations are possible. Further, aspects from two or more of the methods may be combined.

Aspects of the following examples may be combined with any of the previous examples or aspects described herein.

Example 1: A method for wireless communication at a wireless equipment comprising: receiving a downlink control message comprising at least one of a modulation and coding scheme associated with at least one uplink transmission or a number of layers associated with the at least one uplink transmission; determining to reduce a first number of bits based at least in part on the at least one of the modulation and coding scheme or the number of layers, wherein the first number of bits comprises at least one of an effective number of bits supported at a digital-to-analog converter of the UE or a number of bits supported at a transmission front end component of the UE; and transmitting the at least one uplink transmission according to the reduced first number of bits.

Example 2: The method of example 1, further comprising: determining to adjust a power consumption level of the UE, wherein determining to reduce the first number of bits is based at least in part on determining to adjust the power consumption level; and adjusting the power consumption level of the UE based at least in part on determining to adjust the power consumption level, wherein transmitting the at least one uplink transmission is based at least in part on adjusting the power consumption level.

Example 3: The method of any of examples 1-2, wherein determining to reduce the first number of bits comprises: determining to reduce the effective number of bits supported at the digital-to-analog converter; and determining to reduce the number of bits supported at the transmission front end component.

Example 4: The method of any of examples 1-3, further comprising: adjusting a power consumption level of the UE based at least in part on reducing the effective number of bits supported at the digital-to-analog converter, or reducing the number of bits supported at the transmission front end component, or both, wherein transmitting the at least one uplink transmission is based at least in part on adjusting the power consumption level.

Example 5: The method of any of examples 1-4, wherein a second number of bits reduced from the effective number of bits supported at the digital-to-analog converter is the same as a third number of bits reduced from the number of bits supported at the transmission front end component.

Example 6: The method of any of examples 1-5, wherein determining to reduce the first number of bits comprises: determining, based on the at least one of the modulation and coding scheme or the number of layers, a second number of bits by which to reduce the effective number of bits supported at the digital-to-analog converter and a third number of bits by which to reduce the number of bits supported at the transmission front end component.

Example 7: The method of any of examples 1-6, wherein determining the second number of bits and the third number of bits comprises: retrieving the second number of bits and the third number of bits based at least in part on the one or more of the modulation and coding scheme or the number of layers.

Example 8: The method of any of examples 1-7, further comprising: determining the at least one of the modulation and coding scheme or the number of layers based at least in part on the downlink control message, wherein determining to reduce the first number of bits is based at least in part on the determining.

Example 9: The method of any of examples 1-8, wherein: receiving the downlink control message comprises receiving downlink control information indicating the at least one of the modulation and coding scheme or the number of layers.

Example 10: The method of any of examples 1-9, wherein one or more bits reduced from the first number of bits are least significant bits of the first number of bits.

Example 11: The method of any of examples 1-10, wherein determining to reduce the first number of bits is based at least in part on the at least one uplink transmission comprising a millimeter-wave transmission.

Example 12: The method of any of examples 1-11, wherein determining to reduce the first number of bits is based at least in part on the at least one uplink transmission comprising a sub-6 gigahertz transmission.

Example 13: The method of any of examples 1-12, wherein the effective number of bits comprises a number of bits associated with a resolution of the digital-to-analog converter, and wherein the effective number of bits is less than the number of bits associated with the resolution of the digital-to-analog converter.

Example 14: An apparatus comprising at least one means for performing a method of any of examples 1-13.

Example 15: An apparatus for wireless communications, comprising a processor; memory in electronic communication with the processor; and instructions stored in the memory and executable by the processor to cause the apparatus to perform a method of any of examples 1-13.

Example 16: A non-transitory computer-readable medium storing code for wireless communications, the code comprising instructions executable by a processor to any of examples 1-13.

Example 17: A method for wireless communication at a base station, comprising: establishing a communication link with a UE; transmitting, to the UE, a downlink control message comprising at least one of a modulation and coding scheme associated with at least one uplink transmission or a number of layers associated with the at least one uplink transmission, wherein the at least one of the modulation and coding scheme or the number of layers indicate to reduce a first number of bits, wherein the first number of bits comprise at least one of an effective number of bits supported at a digital-to-analog converter of the UE or a number of bits supported at a transmission front end component of the UE; and receiving, from the UE, the at least one uplink transmission based at least in part on the at least one of the modulation and coding scheme or the number of layers indicating to reduce the first number of bits.

Example 18: The method of example 16, further comprising: determining to adjust a power consumption level of the UE, wherein the at least one of the modulation and coding scheme and the number of layers are based at least in part on determining to adjust the power consumption level, and wherein receiving the at least one uplink transmission is based at least in part on determining to adjust the power consumption level of the UE.

Example 19: The method of any of examples 16 or 17, wherein the at least one of the modulation and coding scheme or the number of layers indicate a second number of bits by which to reduce the effective number of bits supported at the digital-to-analog converter and a third number of bits by which to reduce the number of bits supported at the transmission front end component.

Example 20: The method of any of examples 16-18, wherein the effective number of bits comprises a number of bits associated with a resolution of the digital-to-analog converter, and wherein the effective number of bits is less than the number of bits associated with the resolution of the digital-to-analog converter.

Example 21: An apparatus comprising at least one means for performing a method of any of examples 16-19.

Example 22: An apparatus for wireless communications, comprising a processor; memory in electronic communication with the processor; and instructions stored in the memory and executable by the processor to cause the apparatus to perform a method of any of examples 16-19.

Example 23: A non-transitory computer-readable medium storing code for wireless communications, the code comprising instructions executable by a processor to any of examples 16-19.

Although aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR networks. For example, the described techniques may be applicable to various other wireless communications systems such as Ultra Mobile Broadband (UMB), Institute of Electrical and Electronics Engineers (IEEE) 802.11 (Wi-Fi), IEEE 802.16 (WiMAX), IEEE 802.20, Flash-OFDM, as well as other systems and radio technologies not explicitly mentioned herein.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative methods, blocks and components described in connection with the disclosure herein may be implemented or performed by any suitable means, for example, including a general-purpose processor, a DSP, an ASIC, a CPU, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (for example, a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. An implementation may include a computer program comprising program instructions which are computer-executable to implement the steps of the various methods as described or parts thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein may be implemented using software executed by a processor, hardware, firmware, hardwiring, or combinations of any of these. Features implementing functions may also be physically located at different locations, including being distributed such that portions of functions are implemented at different physical locations.

Computer-readable media includes both non-transitory computer storage media and communication media including any medium that facilitates transfer of a computer program from one place to another. A non-transitory storage medium may be any available medium that may be accessed by a general-purpose or special purpose computer. By way of example, and not limitation, non-transitory computer-readable media may include random-access memory (RAM), read-only memory (ROM), electrically erasable programmable ROM (EEPROM), flash memory, compact disk (CD) ROM or other optical disk storage, magnetic disk storage or other magnetic storage devices, or any other non-transitory medium that may be used to carry or store desired program code means in the form of instructions or data structures and that may be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of computer-readable medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (in other words, A and B and C). Also, as used herein, the phrase "based on" shall not be construed as a reference to a closed set of conditions. For example, an example feature that is described as "based on condition A" may be based on both a condition A and a condition B without departing from the scope of the present disclosure. In other words, as used herein, the phrase "based on" shall be construed in the same manner as the phrase "based at least in part on."

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "example" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, known structures and devices are shown in block diagram form in order to avoid obscuring the concepts of the described examples.

The description herein is provided to enable a person having ordinary skill in the art to make or use the disclosure. Various modifications to the disclosure will be apparent to a person having ordinary skill in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication at a user equipment (UE), comprising:
receiving a downlink control message indicating at least one of a modulation and coding scheme associated with at least one uplink transmission or a number of layers associated with the at least one uplink transmission;
determining to adjust a power consumption level of the UE;
adjusting, based at least in part on determining to adjust the power consumption level and based at least in part on the at least one of the modulation and coding scheme or the number of layers, a resolution of bits, associated with the at least one uplink transmission, input to a digital-to-analog converter (DAC) of the UE or a transmission front end component (TxFE) of the UE to adjust an effective number of bits (ENOB) associated with the DAC or a number of bits (NOB) associated with the TxFE, respectively; and
transmitting the at least one uplink transmission according to the adjusted ENOB or NOB.

2. The method of claim 1, wherein adjusting the resolution of bits comprises determining, based on the at least one of the modulation and coding scheme or the number of layers, a second number of bits by which to adjust the ENOB and a third number of bits by which to adjust the NOB.

3. The method of claim 2, wherein determining the second number of bits and the third number of bits comprises retrieving the second number of bits and the third number of bits based at least in part on the one or more of the modulation and coding scheme or the number of layers.

4. The method of claim 1, wherein receiving the downlink control message comprises receiving downlink control information indicating the at least one of the modulation and coding scheme or the number of layers.

5. The method of claim 1, wherein adjusting the resolution of bits comprises reducing the resolution of bits based on dropping least significant bits of the bits.

6. The method of claim 1, further comprising determining to adjust the resolution of bits based at least in part on the at least one uplink transmission comprising a millimeter-wave transmission.

7. The method of claim 1, further comprising determining to adjust the resolution of bits based at least in part on the at least one uplink transmission comprising a sub-6 gigahertz transmission.

8. An apparatus for wireless communication at a user equipment (UE), comprising:
a processor,
memory in electronic communication with the processor, and
instructions stored in the memory and executable by the processor to cause the apparatus to:
receive a downlink control message indicating at least one of a modulation and coding scheme associated with at least one uplink transmission or a number of layers associated with the at least one uplink transmission;
determine to adjust a power consumption level of the UE;
adjust, based at least in part on determining to adjust the power consumption level and based at least in part on the at least one of the modulation and coding scheme or the number of layers, a resolution of bits, associated with the at least one uplink transmission, input to a digital-to-analog converter (DAC) of the UE or a transmission front end component (TxFE) of the UE to adjust an effective number of bits (ENOB) associated with the DAC or a number of bits (NOB) associated with the TxFE, respectively; and
transmit the at least one uplink transmission according to the adjusted ENOB or NOB.

9. The apparatus of claim 8, wherein the instructions to adjust the resolution of bits are executable by the processor to cause the apparatus to determine, based on the at least one of the modulation and coding scheme or the number of layers, a second number of bits by which to adjust the ENOB and a third number of bits by which to adjust the NOB.

10. The apparatus of claim 9, wherein the instructions to determine the second number of bits and the third number of bits are executable by the processor to cause the apparatus to retrieve the second number of bits and the third number of bits based at least in part on the one or more of the modulation and coding scheme or the number of layers.

11. The apparatus of claim 8, wherein the instructions to receive the downlink control message are executable by the processor to cause the apparatus to receive downlink control information indicating the at least one of the modulation and coding scheme or the number of layers.

12. The apparatus of claim 8, wherein adjusting the resolution of bits comprises reducing the resolution of bits based on dropping least significant bits of the bits.

13. The apparatus of claim 8, further comprising determining to adjust the resolution of bits based at least in part on the at least one uplink transmission comprising a millimeter-wave transmission.

14. A method for wireless communication at a user equipment (UE), comprising:
receiving a downlink control message indicating at least one of a modulation and coding scheme associated with at least one uplink transmission or a number of layers associated with the at least one uplink transmission;
reducing, based at least in part on the at least one of the modulation and coding scheme or the number of layers, a first resolution of bits, associated with the at least one uplink transmission, input to a digital-to-analog converter (DAC) of the UE or a second resolution of bits input to a transmission front end component (TxFE) of the UE to reduce an effective number of bits (ENOB) associated with the DAC or a number of bits (NOB) associated with the TxFE, respectively, the reducing of the ENOB or the NOB reducing a power consumption level of the UE; and
transmitting the at least one uplink transmission according to the adjusted ENOB or NOB.

15. The method of claim 14, wherein the ENOB is adjusted by the same number of bits as the NOB is adjusted.

16. An apparatus for wireless communication at a user equipment (UE), comprising:
a processor,
memory in electronic communication with the processor, and
instructions stored in the memory and executable by the processor to cause the apparatus to:
receive a downlink control message indicating at least one of a modulation and coding scheme associated with at least one uplink transmission or a number of layers associated with the at least one uplink transmission;
reduce, based at least in part on the at least one of the modulation and coding scheme or the number of layers, a first resolution of bits, associated with the at least one uplink transmission, input to a digital-to-analog converter (DAC) of the UE or a second resolution of bits input to a transmission front end component (TxFE) of the UE to reduce an effective number of bits (ENOB) associated with the DAC or a number of bits (NOB) associated with the TxFE, respectively, the reducing of the ENOB or the NOB reducing a power consumption level of the UE; and transmit the at least one uplink transmission according to the adjusted ENOB or NOB.

17. The apparatus of claim 16, wherein the ENOB is adjusted by the same number of bits as the NOB is adjusted.

18. A method for wireless communication at a base station, comprising:

establishing a communication link with a user equipment (UE);

transmitting, to the UE, a downlink control message comprising at least one of a modulation and coding scheme associated with at least one uplink transmission or a number of layers associated with the at least one uplink transmission, wherein the at least one of the modulation and coding scheme or the number of layers indicates to adjust a resolution of bits, associated with the at least one uplink transmission, input to a digital-to-analog converter (DAC) of the UE or a transmission front end component (TxFE) of the UE to adjust an effective number of bits (ENOB) associated with the DAC or a number of bits (NOB) associated with the TxFE, respectively, wherein the at least one of the modulation and coding scheme or the number of layers indicate a second number of bits by which to adjust the ENOB and a third number of bits by which to adjust the NOB; and receiving, from the UE, the at least one uplink transmission based at least in part on the at least one of the modulation and coding scheme or the number of layers indicating to adjust the resolution of bits.

19. The method of claim 18, further comprising:

determining that a signal to noise ratio (SNR) associated with a transmission of the UE is above a threshold amount; and transmitting the downlink control message based at least in part on the determining.

20. An apparatus for wireless communication at a base station, comprising:

a processor, memory in electronic communication with the processor, and instructions stored in the memory and executable by the processor to cause the apparatus to:

establish a communication link with a user equipment (UE);

transmit, to the UE, a downlink control message comprising at least one of a modulation and coding scheme associated with at least one uplink transmission or a number of layers associated with the at least one uplink transmission, wherein the at least one of the modulation and coding scheme or the number of layers indicates to adjust a resolution of bits, associated with the at least one uplink transmission, input to a digital-to-analog converter (DAC) of the UE or a transmission front end component (TxFE) of the UE to adjust an effective number of bits (ENOB) associated with the DAC or a number of bits (NOB) associated with the TxFE, respectively, wherein the at least one of the modulation and coding scheme or the number of layers indicate a second number of bits by which to adjust the ENOB and a third number of bits by which to adjust the NOB; and receive, from the UE, the at least one uplink transmission based at least in part on the at least one of the modulation and coding scheme or the number of layers indicating to adjust the resolution of bits.

\* \* \* \* \*